(12) United States Patent
Yano et al.

(10) Patent No.: US 8,920,683 B2
(45) Date of Patent: Dec. 30, 2014

(54) SPUTTERING TARGET, TRANSPARENT CONDUCTIVE FILM AND TRANSPARENT ELECTRODE

(71) Applicant: Idemitsu Kosan Co., Ltd., Tokyo (JP)

(72) Inventors: Koki Yano, Sodegaura (JP); Kazuyoshi Inoue, Sodegaura (JP); Nobuo Tanaka, Sodegaura (JP); Akira Kaijo, Sodegaura (JP); Satoshi Umeno, Sodegaura (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 0 days.

(21) Appl. No.: 13/713,771

(22) Filed: Dec. 13, 2012

(65) Prior Publication Data

US 2013/0118774 A1    May 16, 2013

Related U.S. Application Data

(62) Division of application No. 12/065,405, filed as application No. PCT/JP2006/317135 on Aug. 30, 2006, now Pat. No. 8,524,123.

(30) Foreign Application Priority Data

Sep. 1, 2005  (JP) ................. 2005-253986
Sep. 20, 2005 (JP) ................. 2005-271665
Oct. 18, 2005 (JP) ................. 2005-303024

(51) Int. Cl.
| | |
|---|---|
| H01B 1/02 | (2006.01) |
| H01B 1/08 | (2006.01) |
| C23C 14/34 | (2006.01) |
| C23C 14/08 | (2006.01) |
| C04B 35/457 | (2006.01) |
| C04B 35/453 | (2006.01) |
| H01B 13/00 | (2006.01) |
| C04B 35/626 | (2006.01) |

(52) U.S. Cl.
CPC .............. *H01B 1/02* (2013.01); *C23C 14/3414* (2013.01); *C04B 2235/80* (2013.01);
(Continued)

(58) Field of Classification Search
CPC .................... H01L 21/02554; H01L 21/02565
USPC .......... 252/182.1, 518.1; 174/126.2; 501/134; 428/697, 469
See application file for complete search history.

(56) References Cited

U.S. PATENT DOCUMENTS

| | | |
|---|---|---|
| 5,972,527 A | 10/1999 | Kaijou et al. |
| 6,533,965 B1 | 3/2003 | Sasaki et al. |

(Continued)

FOREIGN PATENT DOCUMENTS

| | | |
|---|---|---|
| JP | 3-50148 A | 3/1991 |
| JP | 6-234565 A | 8/1994 |

(Continued)

OTHER PUBLICATIONS

Office Action for related Japanese Patent Application No. 2011-198019 dated Feb. 12, 2014.

(Continued)

*Primary Examiner* — Khanh Tuan Nguyen
(74) *Attorney, Agent, or Firm* — Millen, White, Zelano & Branigan, P.C.

(57) ABSTRACT

A sputtering target which is composed of a sintered body of an oxide which contains at least indium, tin, and zinc and includes a spinel structure compound of $Zn_2SnO_4$ and a bixbyite structure compound of $In_2O_3$. A sputtering target includes indium, tin, zinc, and oxygen with only a peak ascribed to a bixbyite structure compound being substantially observed by X-ray diffraction (XRD).

20 Claims, 7 Drawing Sheets

(52) U.S. Cl.
CPC ... *C04B 2235/6567* (2013.01); *C04B 2235/786* (2013.01); *C23C 14/086* (2013.01); *C04B 2235/763* (2013.01); *C04B 2235/3286* (2013.01); *C04B 2235/72* (2013.01); *C04B 2235/3241* (2013.01); *C04B 2235/6562* (2013.01); *C04B 2235/3418* (2013.01); *C04B 2235/3293* (2013.01); *C04B 35/457* (2013.01); *C04B 2235/77* (2013.01); *C04B 2235/664* (2013.01); *C04B 2235/3281* (2013.01); *C04B 35/453* (2013.01); *H01B 13/00* (2013.01); *C04B 2235/96* (2013.01); *C04B 2235/5445* (2013.01); *C04B 2235/656* (2013.01); *C04B 2235/3232* (2013.01); *C04B 35/6261* (2013.01); *C04B 2235/3284* (2013.01); *C04B 2235/3272* (2013.01); *C04B 2235/32* (2013.01)
USPC .................. 252/518.1; 252/182.1; 174/126.2; 428/469; 428/697; 501/134

(56) References Cited

U.S. PATENT DOCUMENTS

| | | | |
|---|---|---|---|
| 6,534,183 | B1 | 3/2003 | Inoue |
| 6,669,830 | B1 * | 12/2003 | Inoue et al. .............. 204/298.13 |
| 6,689,477 | B2 | 2/2004 | Inoue |
| 6,894,745 | B2 | 5/2005 | Fujimori et al. |
| 6,998,070 | B2 | 2/2006 | Inoue et al. |
| 7,236,220 | B2 * | 6/2007 | Kim et al. ..................... 349/106 |
| 7,291,283 | B2 | 11/2007 | Uesugi et al. |
| 7,336,261 | B2 | 2/2008 | Yu |
| 8,153,031 | B2 | 4/2012 | Yano et al. |
| 2001/0008437 | A1 | 7/2001 | Fujimori et al. |
| 2003/0122799 | A1 | 7/2003 | Yu |
| 2003/0148871 | A1 * | 8/2003 | Inoue ............................. 501/134 |
| 2003/0203624 | A1 * | 10/2003 | Sameshima et al. .......... 438/687 |
| 2004/0081836 | A1 * | 4/2004 | Inoue et al. ................... 428/469 |
| 2005/0140877 | A1 | 6/2005 | Jeoung et al. |
| 2007/0037402 | A1 | 2/2007 | Inoue |
| 2007/0117237 | A1 | 5/2007 | Inoue |
| 2011/0260118 | A1 | 10/2011 | Yano et al. |

FOREIGN PATENT DOCUMENTS

| | | | | |
|---|---|---|---|---|
| JP | 06318406 | A2 | 11/1994 | |
| JP | 07 335046 | | 12/1995 | |
| JP | 8-171824 | A | 7/1996 | |
| JP | 10 083719 | | 3/1998 | |
| JP | 2000072537 | A2 | 3/2000 | |
| JP | 2000-256061 | | 9/2000 | |
| JP | 2000256060 | A2 | 9/2000 | |
| JP | 2000256838 | A2 | 9/2000 | |
| JP | 2000305104 | A | 11/2000 | |
| JP | 2000-340033 | * | 12/2000 | ............... H01B 1/08 |
| JP | 200183545 | A | 3/2001 | |
| JP | 2001155549 | A2 | 6/2001 | |
| JP | 2001-272674 | A | 10/2001 | |
| JP | 2001 318389 | | 11/2001 | |
| JP | 2001311954 | A2 | 11/2001 | |
| JP | 2002-30429 | A | 1/2002 | |
| JP | 2002208704 | A | 7/2002 | |
| JP | 2004-30934 | A | 1/2004 | |
| JP | 2004-240091 | A | 8/2004 | |
| JP | 2008280216 | A | 11/2008 | |
| TW | 514 622 | | 12/2002 | |
| TW | 200301440 | A | 7/2003 | |
| TW | 1 225 521 | | 12/2004 | |
| TW | 2005 08410 | | 3/2005 | |
| TW | 2005 25225 | | 8/2005 | |
| WO | WO 0138599 | A1 | 5/2001 | |
| WO | WO 2004105054 | A1 | 12/2004 | |

OTHER PUBLICATIONS

English translation of Japanese Patent Application No. 2004-30934 dated Feb. 18, 2014, publication date Jan. 29, 2004.
Idemitsu Kosan Co Ltd., Manufacturing Method of Sputtering Target and Conductive Film Using It, Transparent Conductive Film Formed by the Method, Patent Abstracts of Japan, publication date Jan. 1, 2004, English Abstract of JP 2004-30934.
Machine Translation of JP 2001083545: Chiyabara Kenichi et al., "Liquid Crystal Display Device" pp. 1-5 (Mar. 30, 2001).
English Abstract of JP 2001083545: Chiyabara Kenichi et al., Espacenet—Bibliographic data—Mar. 30, 2001.
English Abstract of JP 2008280216: Yano Kiminori et al., Espacenet—Bibliographic data—Nov. 20, 2008.
Machine Translation of JP2000305104: Chiyabara Kenichi et al., "Liquid Crystal Display Device and Manufacture Thereof" pp. 1-14 (Nov. 2, 2000).
English Abstract of JP2000305104: Chiyabara Kenichi et al., Espacenet—Bibliographic data—Nov. 2, 2000.
Machine Translation of JP2002208704: Kato Tomoya et al., "Method of Manufacturing Thin-Film Transistor and Etching Liquid Therefor" pp. 1-5 (Jul. 26, 2002).
English Abstract of JP2002208704: Kato TOmoya et al., Espacenet—Bibliographic data—Jul. 26, 2002.
Decision of Rejection of Japanese Patent Application No. 2011-198019 dated Jul. 1, 2014.
International Search Report for PCT/JP2006/317135 (Nov. 14, 2006).
"Technology of Transparent Conductive Film", pp. 169-171 (1999).
K. Nakashima, "ITO Sputtering Target and Indium Resources", Ceramics, vol. 37, No. 9 (2002) pp. 675-678.
T. Moriga et al., "Phase Relationships and Physical Properties of Homologous Compounds in the Zinc Oxide—Indium Oxide System", Journal of the American Ceramic Society, vol. 81, No. 5 (1998) pp. 1310-1316.
Inoue Kazuyoshi et al., "Transparent Electrode Substrate, Its Manufacturing Method and Liquid Crystal Device", Publication Date: Nov. 16, 2001; English Abstract of JP 2001-318389.
Japanese Office Action relating to JP-A-H10-083719 (D1), JP-A-H07-335046 (D2) and JP-A-2001-318389 (D3), May 17, 2011.
Minami Uchitsugu et al., "Transparent Conductive Film", Patent Abstract of Japan, Publication Date: Mar. 31, 1998; English Abstract of JP 10-083719.
Tomai Shigekazu et al., "Manufacture of Conductive Transparent Substrate", Patent Abstract of Japan, Publication Date: Dec. 12, 1995; English Abstract of JP 07-335046.
Translation of parts of the Japanese Office Action relating to JP-A-H10-083719 (D1), JP-A-H07-335046 (D2) and JP-A-2001-318389 (D3), May 17, 2011.
LG Philips LCD Co., "Trans-reflective type liquid crystal display device and method for fabricating the same," Publication Date: Aug. 1, 2005; English Abstract of TW-2005 25225.
Mitsui Mining & Smelting Co., Ltd., "Sputtering Target," Publication Date: Mar. 1, 2005; English Abstract of TW-2005 08410.
Nikko Materials Co., Ltd., "Sputtering target and method of manufacture," Publication Date: Dec. 21, 2004; English Abstract of TW-1 225 521.
Office Action in related Taiwanese Patent Application No. 095132462, Aug. 24, 2012.
Translation of part of Taiwanese Office Action relating to TW200508410 and TW1225521, Aug. 24, 2012.
Office Action for related Taiwanese Patent Application No. 101141146 dated Apr. 29, 2014.

* cited by examiner

FIG.6
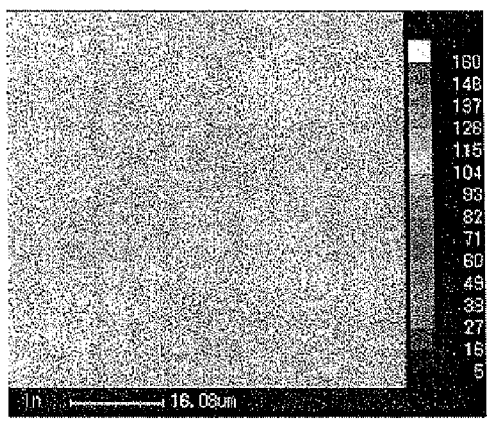
In SPECTRUM
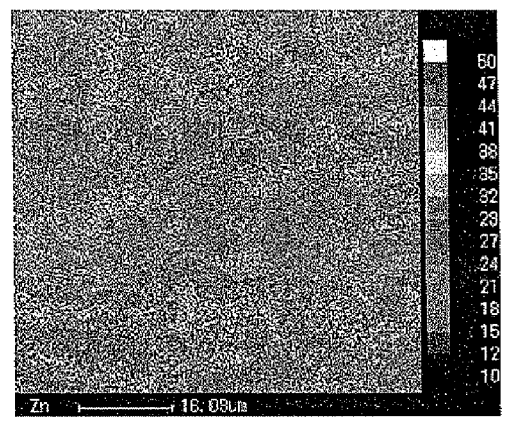
Zn SPECTRUM

FIG. 8
(a) 
(b) 
(c) 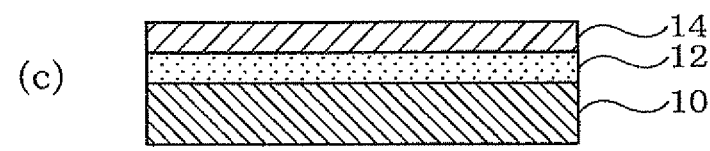
(d) 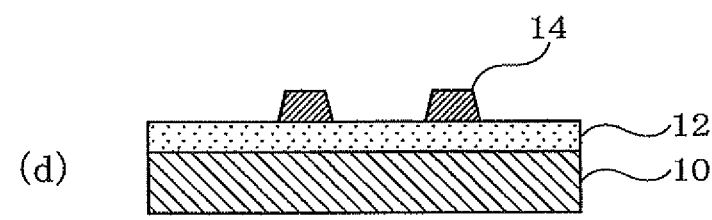
(e) 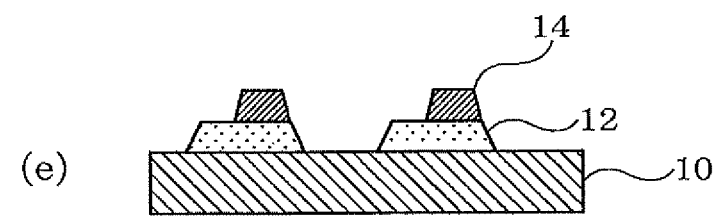

SPUTTERING TARGET, TRANSPARENT CONDUCTIVE FILM AND TRANSPARENT ELECTRODE

This application is a divisional application of U.S. Ser. No. 12/065,405, filed Mar. 15, 2010.

TECHNICAL FIELD

The present invention relates to a sputtering target prepared by sintering (hereinafter may referred to as sputtering target or as a target) and a method for preparing a sputtering target. The invention also relates to a transparent conductive film obtained by using a sputtering target, and a transparent electrode.

BACKGROUND ART

In recent years, development of displays has been remarkable. A liquid crystal display (LCD), an electroluminescence display (EL), a field emission display (FED), or the like is used as a display device for business machines such as a personal computer and a word processor, and a display device for control systems in factories. These displays have a sandwich structure in which a display device is held between transparent conductive oxides.

A main stream material for such a transparent conductive oxide is indium tin oxide (hereinafter may abbreviated as "ITO") prepared by a sputtering method, an ion plating method, or a vapor deposition method as described in Non-patent Document 1.

ITO is composed of a specific amount of indium oxide and tin oxide, possesses excellent transparency and conductivity, can be etched using a strong acid, and exhibits high adhesion to a substrate.

Although ITO has excellent properties as a material for transparent conductive oxide, ITO is not only a scarce resource, but also contains a large amount (about 90 atomic percent) of indium which is a biologically harmful element. Moreover, the indium itself produces nodules (projections) during sputtering. The nodules produced on the target surface have been one of the causes of abnormal electrical discharge. In particular, when an amorphous ITO film is produced for improving etching properties, the indium compound on the surface of the target is reduced due to introduction of a small amount of water and hydrogen gas in the sputtering chamber, giving rise to further production of nodules. If an abnormal electrical discharge occurs, scattered materials become attached to the transparent conductive oxide as impurities during or immediately after the film formation.

The indium content in ITO must be reduced due to these problems of instability of supply (scarcity) and hazardous properties. However, the maximum solid solubility limit of tin oxide to indium oxide is considered to be about 10%. If the content of indium in ITO is reduced to 90 atomic percent or less, tin oxide remains in the target in the form of a cluster. Since the resistance of tin oxide is 100 or more times stronger than the resistance of ITO, the remaining tin oxide causes charges to accumulate during sputtering, which causes arcing, destroys the target surface, causes small fragments to scatter, and generates nodules and particles (Non-patent Document 2). Therefore, it is difficult to reduce the content of indium to 90 atomic percent or less.

As a method for preventing generation of nodules and suppressing abnormal electrical discharge, a hexagonal layered compound of $In_2O_3(ZnO)_m$, wherein m is an integer of 2 to 20, with a crystal grain diameter of 5 μm or less has been investigated (Patent Documents 1 and 2). However, if the indium content is reduced to 90 to 70 atomic percent or less in this method, there are problems such as decrease of the sintered density and conductivity of the target, which causes abnormal electrical discharge and retards the film forming speed; low target strength, leading to easy cracking; and poor heat resistance in the presence of air of the transparent conductive film formed by sputtering. Moreover, a high temperature is required in order to produce the hexagonal layered compound in a stable manner. This brings about another problem of a high industrial manufacturing cost. Furthermore, the hexagonal layered compound has no resistance to an etching solution containing phosphoric acid used for etching of a metal or an alloy. Thus etching of the metal or alloy membrane formed on the film of the hexagonal layered compound is difficult.

As a transparent conductive film with a significantly reduced indium content, a transparent conductive film containing zinc oxide and tin oxide as major components has been studied (Patent Document 3). However, this method has problems such as difficulty in sputtering due to unduly high target resistance and a tendency of easy generation of abnormal electrical discharge. No study of a sputtering target to solve these problems has been undertaken.

Patent Document 0.4 discloses a zinc oxide sintered body doped with different kinds of elements containing a spinel structure ($ZnX_2O_4$, wherein X is an element with a positive trivalent or higher valency). However, no studies have been done on the effect of a sintered body having both a spinel structure compound of $Zn_2SnO_4$ and a bixbyite structure compound of $In_2O_3$.

Although the ITO target which is a sintered body essentially consisting of a bixbyite structure compound of $In_2O_3$ has been studied (Patent Document 5), $Sn_3In_4O_{12}$ and the like are easily produced in the ITO target. Even if a sintered body essentially consisting of a bixbyite structure compound could be produced, only a narrow range of manufacturing conditions is allowed. Stable production of such an ITO target has been difficult. If the content of indium is reduced, production of a sintered body essentially consisting of a bixbyite structure compound is difficult.

It is known that in the IZO target which composed of indium and zinc, a hexagonal layered compound of $In_2O_3(ZnO)_m$, wherein m is an integer of 2 to 20, is formed when the Zn content is 15 to 20 atomic percent (Non-patent Document 3). These crystal types have an effect of decreasing the target resistance and increasing the relative density as compared with ZnO. However, if the amount of indium is reduced (or the amount of zinc is increased), problems such as a decrease in the target strength and retardation of the film-forming speed may occur by increased target resistance and described relative density.

On the other hand, due to the progress of liquid crystal display functions in recent years, it has become necessary to use an electrode substrate with a metal or an alloy disposed on a transparent conductive film, such as an electrode substrate for a semi-transmissive, semi-reflective liquid crystal.

Patent Document 6 discloses a liquid crystal display device which has a transmissive region and a reflective region on a transparent conductive film. Patent Document 7 discloses that a film forming-etching process can be simplified by using a transparent conductive film possessing selective etching properties, that is, a transparent conductive film which is etched by an acid not corrosive to a metal, but is resistant to and etched only with difficulty by an etching solution used for etching metals. However, the method of Patent Document 7 may change the crystallization temperature and the work function of a transparent conductive film due to the addition of lanthanoids. Moreover, it is necessary to add lanthanoid oxide, which is a scarce resource, to the transparent conductive film in order to adjust the etching rate. Furthermore, there is almost no reduction in the indium content of the transparent conductive film.

[Patent Document 1] WO 01/038599
[Patent Document 2] JP-A-06-234565
[Patent Document 3] JP-A-08-171824
[Patent Document 4] JP-A-03-50148
[Patent Document 5] JP-A-2002-030429
[Patent Document 6] JP-A-2001-272674
[Patent Document 7] JP-A-2004-240091
[Non-patent Document 1] "Technology of Transparent Conductive Film" edited by The 166th Committee of Transparent Oxide and Photoelectron Material, Japan Society for Promotion of Science, Ohmsha, Ltd. (1999)
[Non-patent Document 2] Ceramics, 37 (2002), No. 9, pp 675-678
[Non-patent Document 3] Journal of the American Ceramic Society, 81(5), 1310-16 (1998))

An object of the invention is to provide a target with low resistance, high theoretical relative density, and high strength, a target with a reduced indium content, a target which allows stable sputtering while suppressing abnormal electrical discharge generated when forming a transparent conductive film by the sputtering method, a method for producing the targets, and a transparent conductive film produced using the sputtering targets.

Another object of the invention is to provide a transparent conductive film which can be selectively etched relative to a metal or an alloy, that is, a transparent conductive film which is etched by an acid not corrosive to a metal or an alloy, but is resistant to or is hardly etched by an etching solution used for etching the metal or alloy.

Still another object of the invention is to provide a transparent conductive film exhibiting a small increase in resistance during a heat treatment in the atmosphere and a small resistance distribution in a large area.

A further object of the invention is to provide a transparent electrode and an electrode substrate made from these transparent conductive films.

A still further object of the invention is to provide a simplified method for producing an electrode substrate from these transparent conductive films.

DISCLOSURE OF THE INVENTION

An oxide sintered target containing indium, tin, and zinc as major components may contain a hexagonal layered compound of $In_2O_3(ZnO)_m$, wherein m is an integer of 2 to 20, a rutile structure compound of $SnO_2$, a wurtzite form compound of ZnO, a spinel structure compound of $Zn_2SnO_4$, a bixbyite structure compound of $In_2O_3$, a spinel structure compound of $ZnIn_2O_4$, and other crystal structures such as $ZnSnO_3$, $Sn_3In_4O_{12}$, and the like, depending on the form of raw materials, thermal history during sintering, the method of heat treatment, the content of components, and the like. Various combinations of these crystal structures are possible.

The inventors of the invention have found that among many combinations of the compounds, a combination of a spinel structure compound of $Zn_2SnO_4$ and a bixbyite structure compound of $In_2O_3$ has a low resistance and a high theoretical relative density, and can form a target with a high strength. Although the reason for this effect cannot completely be elucidated, it is assumed that under specific sintering conditions in specific compositions, In is easily dissolved as a solid solute in a spinel structure compound of $Zn_2SnO_4$, and Sn and the like are easily dissolved as a solid solute in a bixbyite structure compound of $In_2O_3$. That is, it is assumed that when positive divalent Zn exists, positive tetravalent Sn is easily dissolved in $In_2O_3$ containing positive trivalent In as a solid solute, whereas when positive divalent Zn and positive tetravalent Sn are present in proximate, positive trivalent In is easily dissolved in $Zn_2SnO_4$ as a solid solute.

Moreover, the inventors of the invention have found that if the crystal structure of a target is substantially a bixbyite structure, the target can exhibit the same etching workability as IZO and the same film performance as the ITO, even if the indium content is reduced to 60 to 75 atomic percent.

The inventors of the invention have further found that the transparent conductive film formed by the sputtering method using these targets excels in conductivity, etching properties, heat resistance, and the like, and is suitable for various applications such as a display represented by a liquid crystal display, a touch panel, a solar cell, and the like even if the content of indium is reduced.

The inventors have further found that since stable sputtering can be carried out, these targets can be used for forming a transparent oxide semiconductor typified by a thin film transistor (TFT) by adjusting the film-forming conditions and the like.

The inventors have further found that a transparent conductive film containing indium, tin, and zinc at a specific atomic ratio can be selectively etched relative to a metal or an alloy.

According to the invention, the following sputtering target, method for producing the same, transparent conductive film, and transparent electrode are provided.

1. A sputtering target which is composed of a sintered body of an oxide comprising at least indium, tin, and zinc and comprising a spinel structure compound of $Zn_2SnO_4$ and a bixbyite structure compound of $In_2O_3$.

2. The sputtering target according to 1, wherein the atomic ratio of In/(In+Sn+Zn) is in a range of 0.25 to 0.6, the atomic ratio of Sn/(In+Sn+Zn) is in a range of 0.15 to 0.3, and the atomic ratio of Zn/(In+Sn+Zn) is in a range of 0.15 to 0.5.

3. The sputtering target according to 1 or 2, wherein in an X-ray diffraction (XRD), the ratio of the maximum peak intensity of the spinel structure compound of $Zn_2SnO_4$ ($I(Zn_2SnO_4)$) to the maximum peak intensity of the bixbyite structure compound of $In_2O_3$ ($I(In_2O_3)$), $I(Zn_2SnO_4)/I(In_2O_3)$, is in a range of 0.05 to 20.

4. The sputtering target according to any one of 1 to 3, wherein, in an X-ray diffraction (XRD), the maximum peak intensity of the rutile structure compound of $SnO_2$ ($I(SnO_2)$), the maximum peak intensity of the spinel structure compound of $Zn_2SnO_4$ ($I(Zn_2SnO_4)$), and the maximum peak intensity of the bixbyite structure compound of $In_2O_3$ ($I(In_2O_3)$) have the following relationship:

$I(SnO_2)<I(Zn_2SnO_4)$ $I(SnO_2)<I(In_2O_3)$ $I(SnO_2)<Max.(I(Zn_2SnO_4),I(In_2O_3))\div10$ wherein Max. (X,Y) indicates the larger of either X or Y.

5. The sputtering target according to any one of 1 to 4, wherein in an X-ray diffraction (XRD), the maximum peak intensity of the wurtzite structure compound of ZnO ($I(ZnO)$), the maximum peak intensity of the spinel structure compound of $Zn_2SnO_4$ ($I(Zn_2SnO_4)$), and the maximum peak intensity of the bixbyite structure compound of $In_2O_3$ ($I(In_2O_3)$) have the following relationship:

$$I(ZnO)<I(Zn_2SnO_4)$$

$$I(ZnO)<I(In_2O_3)$$

$$I(ZnO)<Max.(I(Zn_2SnO_4),I(In_2O_3))\div 10$$

wherein Max. (X,Y) indicates the larger of either X or Y.

6. The sputtering target according to any one of 1 to 5, wherein, in an X-ray diffraction (XRD), the maximum peak intensity of the hexagonal layered compound of $In_2O_3(ZnO)_m$, wherein m is an integer of 2 to 20, $(I/In_2O_3(ZnO)_m)$, the maximum peak intensity of the spinel structure compound of $Zn_2SnO_4$ $(I(Zn_2SnO_4))$, and the maximum peak intensity of the bixbyite structure compound of $In_2O_3$ $(I(In_2O_3))$ have the following relationship:

$$I(In_2O_3(ZnO)<I(Zn_2SnO_4)$$

$$I(In_2O_3(ZnO)_m)<I(In_2O_3)$$

$$(In_2O_3ZnO)_m)<Max.(I(Zn_2SnO_4),I(In_2O_3))\div 10$$

wherein Max. (X,Y) indicates the larger of either X or Y.

7. The sputtering target according to any one of 1 to 6, wherein, in the image of an electron probe micro analyzer (EPMA), indium rich parts S(In) and lead rich parts S(Zn) form a sea-island structure with a ratio of the areas S(Zn)/S (In) in a range of 0.05 to 100.

8. The sputtering target according to any one of 1 to 7, wherein the bixbyite structure compound of $In_2O_3$ has a crystal grain diameter of 10 μm or less.

9. The sputtering target according to any one of 1 to 8, of which the bulk resistance is in a range of 0.3 to 100 mΩ·cm.

10. The sputtering target according to any one of 1 to 9, having a theoretical relative density of 90% or more.

11. A method for producing the sputtering target according to any one of 1 to 10, comprising the steps of:
    preparing a mixture of a powder of an indium compound, a powder of a zinc compound, and a powder of a tin compound having a particle diameter smaller than the particle diameters of the powders of the indium compound and the zinc compound at an atomic ratio of In/(In+Sn+Zn) in a range of 0.25 to 0.6, an atomic ratio of Sn/(In+Sn+Zn) in a range of 0.15 to 0.3, and an atomic ratio of Zn/(In+Sn+Zn) in a range of 0.15 to 0.5;
    press-molding the mixture to obtain a molded product; and
    sintering the molded product.

12. A transparent conductive film obtained by sputtering the sputtering target according to any one of 1 to 10.

13. A transparent electrode obtained by etching the transparent conductive film according to 12.

14. A sputtering target comprising indium, tin, zinc, and oxygen with only a peak ascribed to a bixbyite structure compound being substantially observed by an X-ray diffraction (XRD).

15. The sputtering target according to 14, wherein the bixbyite structure compound is shown by $In_2O_3$.

16. The sputtering target according to 14 or 15, wherein the atomic ratio of In/(In+Sn+Zn) is in a range larger than 0.6 and smaller than 0.75, and the atomic ratio of Sn/(In+Sn+Zn) is in a range of 0.11 to 0.23.

17. The sputtering target according to any one of 14 to 16, wherein, in an X-ray diffraction (XRD), the maximum peak position of the bixbyite structure compound shifts toward the plus direction (wide angle side) compared to an $In_2O_3$ single crystal powder.

18. The sputtering target according to any one of 14 to 17, wherein the average diameter of Zn aggregates observed by an electron probe micro analyzer (SPMA) is 50 μm or less.

19. The sputtering target according to any one of 14 to 18, wherein the content of each of Cr and Cd is 10 ppm (by mass) or less.

20. The sputtering target according to any one of 14 to 19, wherein the content of each of Fe, Si, Ti, and Cu is 10 ppm (by mass) or less.

21. The sputtering target according to any one of 14 to 20, wherein the bixbyite structure compound has a crystal grain diameter of 20 μm or less.

22. The sputtering target according to any one of 14 to 21, of which the bulk resistance is in a range of 0.2 to 100 mΩ·cm.

23. The sputtering target according to any one of 14 to 22, having a theoretical relative density of 90% or more.

24. A method for producing a sputtering target comprising the steps of:
    preparing a mixture of raw material compounds of indium, tin, and zinc at an atomic ratio of In/(In+Sn+Zn) in a range larger than 0.6 and smaller than 0.75, and an atomic ratio of Sn/(In+Sn+Zn) in a range of 0.11 to 0.23;
    press-molding the mixture to obtain a molded product;
    heating the molded product at a rate of 10 to 1,000° C./hour;
    firing the molded product at a temperature in a range of 1,100 to 1,700° C. to obtain a sintered body; and
    cooling the sintered body at a rate of 10 to 1,000° C./hour.

25. A transparent conductive film obtained by sputtering the sputtering target according to any one of 14 to 23.

26. A transparent electrode obtained by etching the transparent conductive film according to 25.

27. The transparent electrode according to 26, having a taper angle at an electrode edge of 30 to 89°.

28. A method for forming a transparent electrode comprising etching the transparent conductive film according to 25 with a 1 to 10 mass % oxalic acid aqueous solution at a temperature in a range of 25 to 50° C.

29. A transparent conductive film comprising an amorphous oxide of indium (In), zinc (Zn), and tin (Sn), satisfying the following atomic ratio 1 when the atomic ratio of Sn to In, Zn, and Sn is 0.20 or less, and the following atomic ratio 2 when the atomic ratio of Sn to In, Zn, and Sn is more than 0.20;

Atomic Ratio 1:

$$0.50<In/(In+Zn+Sn)<0.75$$

$$0.11<Sn/(In+Zn+Sn)\leq 0.20$$

$$0.11<Zn/(In+Zn+Sn)<0.34$$

Atomic Ratio 2:

$$0.30<In/(In+Zn+Sn)<0.60$$

$$0.20<Sn/(In+Zn+Sn)<0.25$$

$$0.14<Zn/(In+Zn+Sn)<0.46$$

30. The transparent conductive film according to 29, having a ratio of the etching rate B when etched with an etching solution containing oxalic acid to the etching rate A when etched with an etching solution containing phosphoric acid (B/A) of 10 or more.

31. A transparent electrode comprising the transparent conductive film according to 29 or 30 with a taper angle of 30 to 89°.

32. An electrode substrate comprising the transparent electrode comprising the transparent conductive film according to 29 or 30 and a layer of a metal or an alloy.

33. The electrode substrate according to 32, wherein the metal or alloy comprises an element selected from the group consisting of Al, Ag, Cr, Mo, Ta, and W.

34. The electrode substrate according to 32 or 33, which is to be used for a semi-transmissive, semi-reflective liquid crystal.

35. The electrode substrate according to any one of 32 to 34, wherein the layer of the metal or alloy is an auxiliary electrode.

36. A method for producing the electrode substrate according to any one of 32 to 35 comprising the steps of:
   preparing a transparent conductive film;
   forming a layer of a metal or an alloy at least on a part of the transparent conductive film;
   etching the layer of a metal or alloy with an etching solution containing an oxo acid; and
   etching the transparent conductive film with an etching solution containing a carboxylic acid.

BRIEF DESCRIPTION OF THE DRAWINGS

FIG. 6 shows an elementary analysis image of the target cross-section of the target produced in Comparative Example 1 taken by an electron probe micro analyzer (EPMA).

FIGS. 8(*a*) to 8(*e*) are drawings schematically showing a method of producing an electrode substrate in Example 10.

BEST MODE FOR CARRYING OUT THE INVENTION

Figure 1:
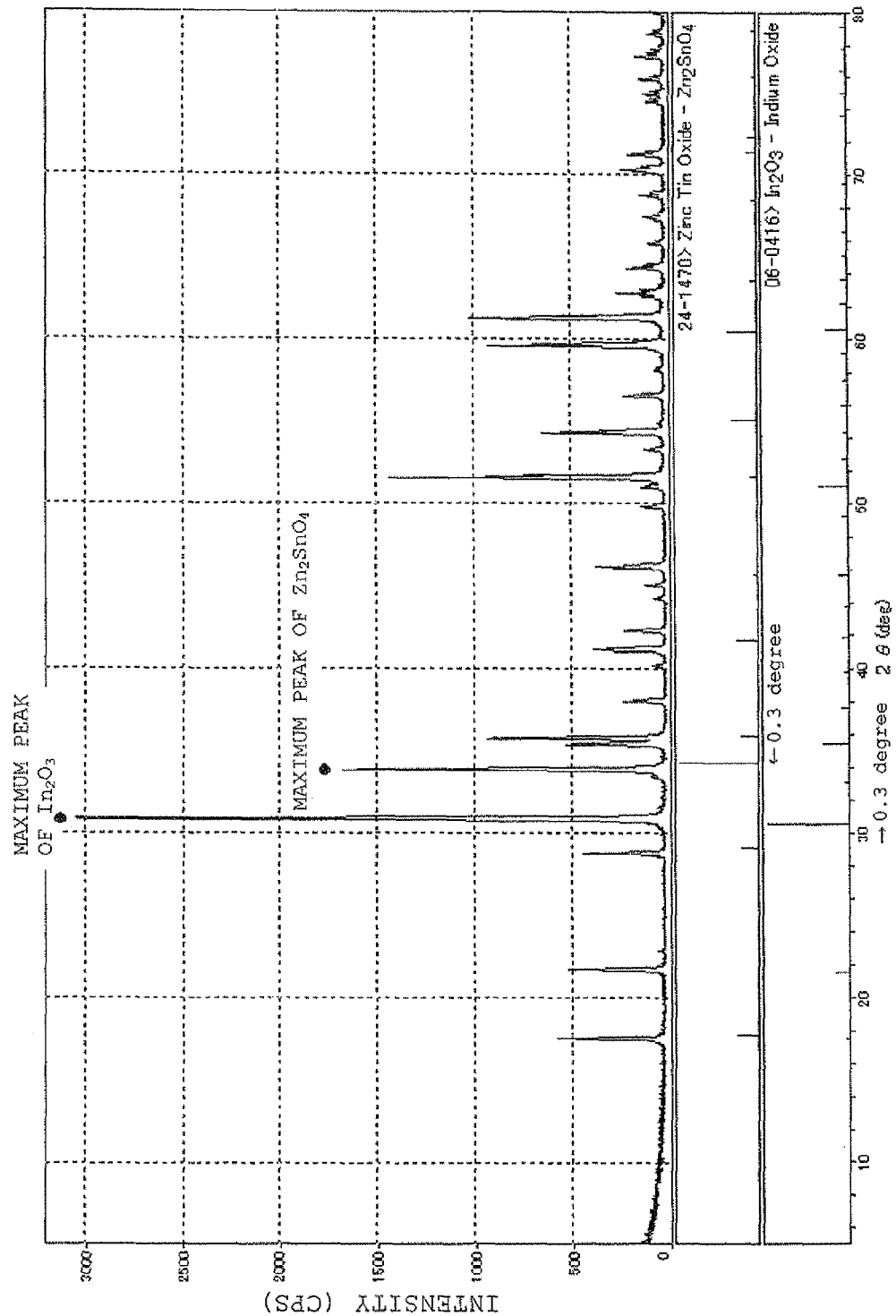
FIG. 1 is a drawing showing an X-ray diffraction chart of the target produced in Example 1.

A first aspect of the invention is described below.

I. Sputtering Target

The sputtering target of the first aspect (hereinafter referred to as "target of the first aspect") is a sintered body of an oxide which contains at least indium, tin, and zinc and includes a spinel structure compound of $Zn_2SnO_4$ and a bixbyite structure compound of $In_2O_3$. The target of the first aspect is preferably a sintered body of an oxide which consists essentially of a spinel structure compound of $Zn_2SnO_4$ and a bixbyite structure compound of $In_2O_3$.

As mentioned above, the target is provided with low resistance, high theoretical relative density, and high strength due to inclusion of both the spinel structure compound shown by $Zn_2SnO_4$ and the bixbyite structure compound shown by $In_2O_3$.

The spinel structure will now be explained.

As described in "Crystal Chemistry" (M. Nakahira, Kodansha, 1973) and the like, an $AB_2X_4$ type or an $A_2BX_4$ type is called a spinel structure, and a compound having such a crystal structure is called a spinel structure compound in general.

In a common spinel structure, anions (usually oxygen) are filled by cubic closest packing with cations being present in part of tetrahedron or octahedron clearances.

A substituted-type solid solution in which some of the atoms and ions in the crystal structure are replaced with other atoms and an interstitial solid solution in which other atoms are added to the sites between gratings are also included in the spinel structure compounds.

The spinel structure compound of the target of the first aspect is a compound shown by $Zn_2SnO_4$. That is, in X-ray diffraction, the compound shows a peak pattern of No. 24-1470 or an analogous (shifted) pattern of the Joint Committee on Powder Diffraction Standards (JCPDS) database.

Next, the bixbyite structure compound is described. A bixbyite structure compound is also referred to as a rare earth oxide C-type or $Mn_2O_3$ (I)-type oxide. As described in "Technology of Transparent Conductive Film" edited by The 166th Committee of Transparent Oxide and Photoelectron Material, Japan Society for Promotion of Science, Ohmsha, Ltd. (1999) and the like, the bixbyite structure compound has a stoichiometric ratio of $M_2X_3$, wherein M is a cation and X is an anion, usually an oxygen ion, and one unit cell is composed of 16 molecules of $M_2X_3$ and the total 80 atoms (32 Ms and 48 Xs). Among these, the bixbyite structure compound of the target of the first aspect is a compound shown by $In_2O_3$, that is, a compound having a peak pattern of No. 06-0416 or an analogous (shifted) pattern of the Joint Committee on Powder Diffraction Standards (JCPDS) database in X-ray diffraction.

A substituted-type solid solution in which some of the atoms and ions in the crystal structure are replaced with other atoms and an interstitial solid solution in which other atoms are added to the sites between gratings are also included in the bixbyite structure compounds.

The crystal conditions of the compound in the target can be judged by observing a sample extracted from the target (sintered body) by X-ray diffraction analysis.

The target of the first aspect preferably has an atomic ratio of $In/(In+Sn+Zn)$ in a range of 0.25 to 0.6, an atomic ratio of $Sn/(In+Sn+Zn)$ in a range of 0.15 to 0.3, and an atomic ratio of $Zn/(In+Sn+Zn)$ in a range of 0.15 to 0.5.

The above atomic ratios of the target of the first aspect can be measured by inductively coupled plasma (ICP) spectrophotometry.

If the atomic ratio of $In/(In+Sn+Zn)$ is less than 0.25, the target may have high bulk resistance and a low density, and the resistance of the transparent conductive film obtained by sputtering the target may increase. If more than 0.6, indium reduction may be insufficient.

If the atomic ratio of $Sn/(In+Sn+Zn)$ is less than 0.15, the target may have reduced strength and increased bulk resistance. Moreover, the heat resistance under atmosphere of the transparent conductive film obtained by sputtering may decrease, durability after connection with wiring may be impaired due to increased contact resistance, and there is a possibility that the probe inspection cannot be done. If larger than 0.3, wet etching may become difficult.

If the atomic ratio of $Zn/(In+Sn+Zn)$ is less than 0.15, wet etching may be difficult; if larger than 0.5, the transparent conductive film obtained by sputtering may have decreased heat resistance and conductivity.

If the atomic ratio is outside of the above-mentioned range, there is a possibility that the spinel structure compound of $Zn_2SnO_4$ and the bixbyite structure of $In_2O_3$ cannot be included in the target at the same time even if the sintering conditions are changed.

The atomic ratio of $In/(In+Sn+Zn)$ is preferably in a range of 0.26 to 0.59, more preferably 0.26 to 0.52, and particularly preferably 0.31 to 0.49.

The atomic ratio of Sn/(In+Sn+Zn) is preferably in a range of 0.17 to 0.24, more preferably 0.19 to 0.24, and particularly preferably 0.21 to 0.24.

The atomic ratio of Zn/(In+Sn+Zn) is preferably in a range of 0.19 to 0.49, more preferably 0.2 to 0.49, and particularly preferably 0.21 to 0.45.

In the target of the first aspect, for peaks in an X-ray diffraction (XRD), the ratio of the maximum peak intensity of the spinel structure compound of $Zn_2SnO_4$ ($I(Zn_2SnO_4)$) to the maximum peak intensity of the bixbyite structure compound of $In_2O_3$ ($I(In_2O_3)$), $I(Zn_2SnO_4)/I(In_2O_3)$, is preferably in a range of 0.05 to 20.

If the ratio of the maximum peak intensity $I(Zn_2SnO_4)/I(In_2O_3)$ is less than 0.05, the amount of the spinel structure compound of $Zn_2SnO_4$ is small. It may be difficult for the density of the target to increase unless heated to a high temperature, the strength of the target may easily decrease, and abnormal electrical discharge may easily occur due to production of a very small amount of SnO (an insulator) resulting from unstable solid dissolution of Sn in $In_2O_3$. If the ratio of the maximum peak intensity ($I(Zn_2SnO_4)/I(In_2O_3)$) is larger than 20, the amount of the bixbyite structure compound of $In_2O_3$ is small. In this case, the resistance of the target may be high.

The above-mentioned ratio of the maximum peak intensity ($I(Zn_2SnO_4)/I(In_2O_3)$) is more preferably in a range of 0.1 to 10, more preferably 0.15 to 7, particularly preferably 0.2 to 5, and most preferably 0.7 to 4.

The ratio of the maximum peak intensity can be determined by calculating from the maximum peak intensity which is present in an arbitrary range (for example, the range of 2θ=15 to 65°) using a chart produced by X-ray diffraction (XDR).

In the case in which it is desired to particularly reduce the resistance of the target, the ratio of the maximum peak intensity ($I(Zn_2SnO_4)/I(In_2O_3)$) is preferably larger than 1. In the case in which it is desired to increase the sintered density, the ratio of the maximum peak intensity ($I(Zn_2SnO_4)/I(In_2O_3)$) is preferably smaller than 1.

Furthermore, it is preferable that both the spinel structure compound of $Zn_2SnO_4$ and the bixbyite structure compound of $In_2O_3$ have a maximum peak strength larger than the maximum peak strength of other compounds to exhibit their effects.

In regard to peaks in an X-ray diffraction (XRD) in the target of the first aspect, it is preferable that the maximum peak intensity of the rutile structure compound of $SnO_2$ ($I(SnO_2)$), the maximum peak intensity of the spinel structure compound of $Zn_2SnO_4$ ($I(Zn_2SnO_4)$), and the maximum peak intensity of the bixbyite structure compound of $In_2O_3$ ($I(In_2O_3)$) satisfy the following relationship:

$I(SnO_2)<I(Zn_2SnO_4)$ $I(SnO_2)<I(In_2O_3)$ $I(SnO_2)<Max.(I(Zn_2SnO_4),I(In_2O_3))\div10$ wherein Max. (X,Y) indicates the larger of either X or Y.

In regard to peaks in an X-ray diffraction (XRD) of the sputtering target of the first aspect, it is preferable that the maximum peak intensity of the wurtzite structure compound of ZnO (I(ZnO)), the maximum peak intensity of the spinel structure compound of $Zn_2SnO_4$ ($I(Zn_2SnO_4)$) and the maximum peak intensity of the bixbyite structure compound of $In_2O_3$ ($I(In_2O_3)$) satisfy the following relationship:

$I(ZnO)<I(Zn_2SnO_4)$ $I(ZnO)<I(In_2O_3)$ $I(ZnO)<MAX.(I(Zn_2SnO_4),I(In_2O_3))\div10$ wherein Max. (X, Y) indicates the larger of either X or Y.

The above relationship formula indicates that the target of the first aspect contains only a small amount of the rutile structure compound of $SnO_2$ and/or the wurtzite form compound of ZnO, or does not substantially contain these compounds.

The rutile structure compound is an $AX_2$-type compound having chains of regular octahedrons which share an edge running parallel to the L axis of tetragonal system and cations arranged in the form of a body-centered tetragonal lattice. Among these compounds, the rutile structure compound of the target of the first aspect is a compound shown by $SnO_2$.

A wurtzite form compound is a four-coordinated, hexagonal packing AX-type compound. Among these compounds, the wurtzite form compound of the target of the first aspect is a compound shown by ZnO.

Further, it is preferable that the target of the first aspect does not substantially contain a complex oxide of $Sn_3In_4O_{12}$.

The complex oxide shown by $Sn_3In_4O_{12}$ is described in "Materia" Vol. 34, No. 3, pp 344-351 (1995), for example.

If the target of the first aspect contains a large amount of the rutile structure compound of $SnO_2$ or the wurtzite form compound of ZnO, problems such as an increase in the bulk resistance of the target, a decrease in the relative density of the target, and the like may occur.

If the target contains the complex oxide of $Sn_3In_4O_{12}$, a slow sputtering rate of $Sn_3In_4O_{12}$ may produce nodules.

In regard to peaks in an X-ray diffraction (XRD) of the target of the first aspect, the maximum peak intensity of hexagonal layered compound of $In_2O_3(ZnO)_m$, wherein m is an integer of 2 to 20, ($I/In_2O_3(ZnO)_m$), the maximum peak intensity of the spinel structure compound of $Zn_2SnO_4$ ($I(Zn_2SnO_4)$), and the maximum peak intensity of the bixbyite structure compound of $In_2O_3$ ($I(In_2O_3)$) preferably satisfy following relationship:

$I(In_2O_3(ZnO)_m)<I(Zn_2SnO_4)$ $I(In_2O_3(ZnO)_m)<I(In_2O_3)$ $I(In_2O_3(ZnO)_m)<Max.(I(Zn_2SnO_4),I(In_2O_3))\div10$ wherein Max. (X,Y) indicates the larger of either X or Y.

The above formulas indicate that the target of the first aspect does not substantially contain or contains only a small amount of the hexagonal layered compound of $In_2O_3(ZnO)_m$, wherein m is an integer of 2 to 20.

The hexagonal layered compound is a compound described in L. Dupont et al., Journal of Solid State Chemistry 158, 119-133 (2001), Toshihiro Moriga et al., J. Am. Ceram. Soc., 81(5), 1310-16 (1998), and the like. The hexagonal layered compound in the first aspect refers to a compound shown by $In_2O_3(ZnO)_m$, wherein m is an integer of 2 to 20, or $Zn_kIn_2O_{k+3}$, wherein k is an integer.

If the target of the first aspect contains a large amount of the hexagonal layered compound of $In_2O_3(ZnO)_m$, wherein m is an integer of 2 to 20, the target may have a high resistance, may produce abnormal electrical discharge, and may be easily cracked due to insufficient strength.

Figure 4:
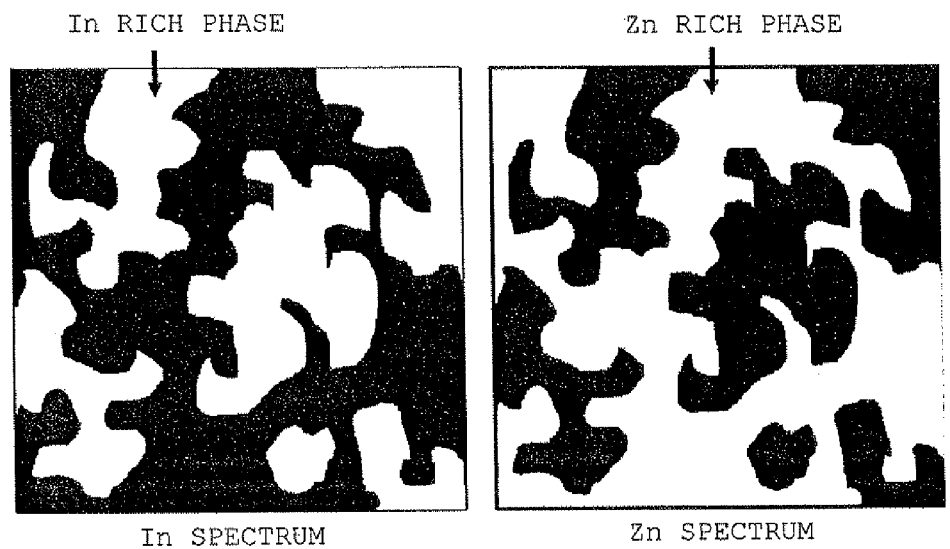
FIG. 4 is a schematic drawing showing the sea-island structure in which an indium (In) rich phase and a zinc (Zn) rich phase are separated in the target of the invention in elementary analysis of the target cross-section by an electron probe micro analyzer (EPMA).

In elementary analysis of the cross-section of the target of the first aspect by an electron probe micro analyzer (EPMA), an indium (In) rich part (hereinafter referred to as an indium (In) rich phase) and a zinc (Zn) rich part (hereinafter referred to as a zinc (Zn) rich phase) form a separated sea-island structure (a schematic drawing is shown in FIG. 4) and the ratio of the indium area S(In) to the zinc area S(Zn), S(Zn)/S(In), is preferably in a range of 0.05 to 100. The areas S(In) and S(Zn) are calculated from images of In and Zn. The ratio of the areas, S(Zn)/S(In), is more preferably 0.05 to 20, still more preferably 0.1 to 10, and particularly preferably 0.2 to 5.

A rich phase means an area with a higher element density (usually 1.5 to 2 times or more) than the element density of the surrounding area by EPMA analysis.

If the indium (In) rich phase and the zinc (Zn) rich phase do not have a sea-island structure or the ratio of the areas S(Zn)/S(In) is not in the range of 0.05 to 100, the density of the target may be reduced, the bulk resistance may be increased, or the strength may be decreased. In particular, when these phases do not have a sea-island structure, the bulk resistance tends to become high. The reason is probably as follows. That is, if the sea-island structure is not formed, a large amount of positive divalent Zn is dissolved as a solid in a positive terivalent In compound and carriers are trapped. The carrier trap reduces the density of carriers and increases the bulk density.

In the target of the first aspect, crystals of the bixbyite structure compound of $In_2O_3$ have a particle diameter preferably of 10 μm or less, more preferably 6 μm or less, and particularly preferably 4 μm or less.

If the crystal grain diameter of the bixbyite structure compound of $In_2O_3$ is more than 10 μm, abnormal electrical discharge and nodules may be caused.

The crystal grain diameter of each compound can be measured using an electron probe micro analyzer (EPMA).

It is preferable that the target of the first aspect have a bulk resistance of 100 mΩ·cm or less and a theoretical relative density of 90% or more.

If the bulk resistance of the target is high or theoretical relative density is less than 90%, the target may crack during discharge.

The bulk resistance of the target of the first aspect is more preferably in the range of 0.3 to 50 mΩ·cm, still more preferably 0.3 to 10 mΩ·cm, particularly preferably 0.4 to 5 mΩ·cm, and most preferably 0.4 to 3 mΩ·cm.

The bulk resistance of the target is measured by the four probe method.

Theoretical relative density of the target of the first aspect is more preferably 95% or more, and particularly preferably 98% or more. If theoretical relative density is less than 90%, the target may have reduced strength or exhibit a retarded film-forming speed, or a film produced by sputtering the target may have a high resistance.

Theoretical relative density is determined as follows.

The density of the target is calculated from the content ratio of ZnO, $SnO_2$, and $In_2O_3$ assuming that their specific gravities are respectively 5.66 g/cm$^3$, 6.95 g/cm$^3$, and 7.12 g/cm$^3$. Then, the ratio of the calculated density to the density measured by Archimedes principle is calculated. The resulting value is used as theoretical relative density.

The deflecting strength of the target of the first aspect is preferably 10 kg/mm$^2$ or more, more preferably 11 kg/mm$^2$ or more, and particularly preferably 12 kg/mm$^2$ or more. There is a possibility that the target may be damaged due to the load applied during transportation and installation. For this reason, the target needs to have deflecting strength of a degree not less than a certain level. If the deflecting strength is less than 10 kg/mm$^2$, the target may not be usable.

The deflecting strength of the target can be measured according to JIS R1601.

II. Method for Producing Sputtering Target

The method for producing the sputtering target of the first aspect (hereinafter may referred to as "method of the first aspect") comprises a step of obtaining a mixture of a powder of an indium compound, a powder of a zinc compound, and a powder of a tin compound having a particle diameter smaller than those of the powder of the indium compound and the powder of the zinc compound in a proportion to make an atomic ratio of In/(In+Sn+Zn) in a range of 0.25 to 0.6, an atomic ratio of Sn/(In+Sn+Zn) in a range of 0.15 to 0.3, and an atomic ratio of Zn/(In+Sn+Zn) in a range of 0.15 to 0.5, a step of press-molding the mixture to obtain a molded product, and a step of sintering the molded product.

Each step of the method of the first aspect is described below.

(1) Mixing Step

The mixing step is an essential step of mixing the raw materials of the sputtering target such as a metal oxide.

As the raw materials, a powder of an indium compound, a powder of a zinc compound, and a powder of a tin compound having a particle diameter smaller than those of the powder of the indium compound and the powder of the zinc compound are used. If the particle diameter of the powder of the tin compound is equal to or larger than those of the powder of the indium compound and the powder of the zinc compound, $SnO_2$ may remain in the target and may increase the bulk resistance of the target.

In addition, it is preferable that the particle diameter of the powder of the tin compound be smaller than the particle diameters of the powder of the indium compound and the powder of the zinc compound. More preferably, the particle diameter of the powder of the tin compound is one half or less of the particle diameters of the powder of the indium compound. It is particularly preferable that the particle diameter of the powder of the zinc compound be smaller than that of the powder of the indium compound.

The particle diameters of the metal compounds used as the raw material of the target can be measured according to JIS R1619.

The oxides of indium, tin, and zinc which are the raw materials of the target must be mixed in a proportion to make the atomic ratio of In/(In+Sn+Zn) in a range of 0.25 to 0.6, the atomic ratio of Sn/(In+Sn+Zn) in a range of 0.15 to 0.3, and the atomic ratio of Zn/(In+Sn+Zn) in a range of 0.15 to 0.5. If the ratios are outside the above ranges, the target of the first aspect having the above-mentioned advantages cannot be obtained.

As examples of the indium compounds, indium oxide, indium hydroxide, and the like can be given.

As examples of the tin compounds, tin oxide, tin hydroxide, and the like can be given.

As examples of the zinc compounds, zinc oxide, zinc hydroxide, and the like can be given.

Among these compounds, oxides are preferable due to ease of sintering and almost no leaving byproduct residues.

The purity of the raw materials is usually 2N (99 mass %) or more, preferably 3N (99.9 mass %) or more, and particularly preferably 4N (99.99 mass %) or more. If the purity is less than 2N, heavy metals such as Cr and Cd may be contained. Such heavy metals may impair durability of the transparent conductive film prepared by using the target, and may cause a hazardous end product.

The raw materials such as metal oxides used for producing the target, which satisfy the above-mentioned particle size relationship, are mixed. It is preferable to homogeneously blend and pulverize the mixture using a common mixer such as a wet ball mill, or a bead mill or an ultrasonic device.

When mixing and pulverizing the raw materials of the target such as metal oxides, the particle diameter of the mixture after pulverization is usually 10 μm or less, preferably 3 μm or less, and particularly preferably 1 μm or less. When the particle diameter of the metal compounds is too large, it may be difficult to increase the density of the target.

The particle diameters of the mixture of the metal compounds used as the raw material of the target after pulverization can be measured according to JIS R1619.

(2) Prefiring Step

A prefiring step is optionally provided in order to preliminarily sinter the mixture of the compounds used as the raw material of the target after preparation of such a mixture.

Prefiring can easily increase the density, but may increase the cost. Therefore, it is desirable to increase the density without prefiring.

In the prefiring step, it is preferable to treat the metal oxide mixture with heat at 500 to 1,200° C. for 1 to 100 hours. If the temperature is lower than 500° C. or the period of heat treatment is less than one hour, thermal decomposition of the indium compound, zinc compound, and tin compound may be insufficient. If the temperature is higher than 1,200° C. or the period of heat treatment is more than 100 hours, the resulting particles may become large.

Therefore, it is particularly preferable to heat-treat (prefire) the mixture at a temperature in a range of 800 to 1,200° C. for 2 to 50 hours.

The prefired body obtained in this step is preferably pulverized before the following molding step and firing step. The pulverization is preferably carried out by using a ball mill, a roll mill, a pearl mill, a jet mill, or the like so that the prefired body has a particle diameter in a range of 0.01 to 1.0 µm. If the particle diameter of the prefired body is less than 0.01 µm, the bulk density is too small to handle the resulting powder with ease. If larger than 1.0 µm, it may be difficult to increase the density of the target.

The particle diameter of the prefired body can be measured according to JIS R1619.

(3) Molding Step

The molding step is an essential step of press-molding the mixture of metal oxides (or the prefired body when the prefiring step is provided) to form the molded product. The product is molded into a form suitable as a target. When the prefiring step is provided, the resulting prefired powder may be granulated and the granules may be formed into a desired shape by press-molding.

Although die molding, cast molding, injection molding, and the like can be given as the method for molding that can be used in this step, a cold isostatic press (CIP) method or the like is preferable in order to obtain a sintered body (target) with a high sintered density.

A mold assistant agent such as polyvinyl alcohol, methyl cellulose, poly wax, and oleic acid may be used in the molding process.

(4) Firing Step

The firing step is an essential step of firing the molded product obtained in the molding step.

The firing can be carried out by hot isostatic press (HIP) firing and the like.

The firing is carried out in an oxygen atmosphere or under an oxygen pressure at a temperature usually of 700 to 1,700° C., preferably 1,100 to 1,650° C., and more preferably 1,300 to 1,600° C. for usually 30 minutes to 360 hours, preferably 8 to 180 hours, and more preferably 12 to 96 hours. If the firing temperature is less than 700° C., it may be difficult to increase the density of the target or it may take too long for sintering. If higher than 1,700° C., the composition may change due to vaporization of the components or there is a possibility of damaging the sintering kiln.

If the firing time is less than 30 minutes, it may be difficult to increase the density of the target. A firing time of more than 360 hours unduly lengthens the production time and results in high production cost.

On the other hand, if the powder mixture is sintered in an atmosphere not containing oxygen gas or at a temperature higher than 1,700° C., a hexagonal layered compound may be produced and formation of spinel crystals (spinel structure compound) may be insufficient, making it difficult to sufficiently increase the density of the resulting target and to adequately suppress the abnormal electrical discharge during sputtering.

The heating rate during firing is usually 20° C./min or less, preferably 8° C./min or less, more preferably 4° C./min or less, still more preferably 2° C./min or less, and particularly preferably 0.5° C./min or less. If the heating rate is more than 20° C./min, a hexagonal layered compound may be produced, leading to insufficient formation of spinel crystals (spinel structure compound).

(5) Reducing Step

A reducing step is optionally provided in order to uniform the bulk resistance of the sintered body obtained in the sintering step throughout the entire target by a reducing treatment.

As examples of the reducing method used in this step, a method of using a reducing gas, a method of reducing by sintering under vacuum, a method of reducing in an inert gas, and the like can be given.

In the case of the method of using a reducing gas, hydrogen, methane, carbon monoxide or a mixture of these gases with oxygen may be used.

In the case of reduction by sintering in an inert gas, nitrogen, argon, or a mixture of these gases with oxygen may be used.

The reducing treatment is carried out usually at 100 to 800° C., and preferably 200 to 800° C., for usually 0.01 to 10 hours, and preferably 0.05 to 5 hours.

(6) Working Step

A working step is optionally provided to cut the sintered body obtained by sintering in the above-mentioned manner into a form suitable for mounting on a sputtering apparatus and to attach a mounting jig such as a backing plate.

The thickness of the target is usually 2 to 20 mm, preferably 3 to 12 mm, and particularly preferably 4 to 6 mm. It is possible to attach two or more targets to one backing plate to obtain a single target in substance. The surface is preferably finished using a No. 200 to 10,000 diamond wheel, and particularly preferably using a No. 400 to 5,000 diamond wheel. If a diamond wheel smaller than No. 200 or larger than No. 10,000 is used, the target may be easily cracked.

In the target of the first aspect, it is preferable that the peak position of the bixbyite structure compound of $In_2O_3$ shift toward the plus side (wide angle side) relative to the peak position of the X-ray diffraction (XRD) of $In_2O_3$ powder. The peak shift, at the maximum peak position (2θ), is preferably 0.05° or more, more preferably 0.1° or more, and particularly preferably 0.2° or more. In view of the shifting toward the plus side (wide angle side), the distance between gratings is probably short by solid-dissolution substitution of a cation having a smaller ionic radius than indium ion. The peak position of the X-ray diffraction (XRD) of $In_2O_3$ powder is disclosed in the Joint Committee on Powder Diffraction Standards (JCPDS) database No. 06-0416.

The peak shift angle can be measured by analyzing the X-ray diffraction chart.

If a shift is directed to the minus side (narrow angle side), there is a possibility that carrier generation is insufficient and the target resistance increases. The reason appears to be that a sufficient amount of carrier electrons are not produced due to an insufficient amount (the number of atoms) of other atoms solid-dissolved in $In_2O_3$.

In the target of the first aspect, the peak position of the spinel structure compound of $Zn_2SnO_4$ preferably shifts to the minus direction (narrow angle side). The peak shift, at the maximum peak position (20), is preferably 0.05° or more, more preferably 0.1° or more, and particularly preferably 0.2° or more. The distance between gratings is assumed to be long in view of the shifting to the minus direction (narrow angle side).

If a shift is directed to the plus side (wide angle side), there is a possibility that carrier generation is insufficient and the target resistance increases. The reason appears to be that a sufficient amount of carrier electrons is not produced due to an insufficient amount (the number of atoms) of other atoms solid-dissolved in $Zn_2SnO_4$.

The peak position of the X-ray diffraction (XRD) of $Zn_2SnO_4$ powder is disclosed in the Joint Committee on Powder Diffraction Standards (JCPDS) database No. 24-1470.

Taking unstable supply (scarcity) and hazardous properties of indium into consideration, the content of indium in the target of the first aspect is preferably 69 wt % or less, more preferably 64 wt % or less, and still more preferably 50 wt % or less.

The atomic ratio of zinc to tin (Zn/Sn) in the target of the first aspect, is preferably in a range of 0.5 to 10, more preferably 0.7 to 7, still more preferably 1 to 4, and particularly preferably 1.1 to 3. If the atomic ratio of zinc to tin (Zn/Sn) is more than 10, the heat resistance under atmosphere may decrease and acid resistance may decrease. If less than 0.5, the etching rate of the transparent conductive film produced by sputtering may be too small, and fine particles of tin oxide may be produced in the target, causing abnormal electrical discharge.

The atomic ratio of zinc to tin (Zn/Sn) can be measured by an inductively coupled plasma (ICP) spectrophotometry.

III. Transparent Conductive Film

The transparent conductive film of the first aspect is formed by the sputtering method using the target of the first aspect.

Although there are no particular limitations to the sputtering method and the sputtering conditions, the direct current (DC) magnetron method, the alternate current (AC) magnetron method, and the high frequency (RF) magnetron method are preferable. Since a large apparatus is required for application to a liquid crystal display (LCD) panel, the DC magnetron method and the AC magnetron method are preferable, with the AC magnetron method which enables stable film forming being particularly preferred.

Sputtering can be carried out under a pressure usually in a range of 0.05 to 2 Pa, preferably 0.1 to 1 Pa, and more preferably 0.2 to 0.8 Pa, under an ultimate pressure usually in a range of $10^{-3}$ to $10^{-7}$ Pa, preferably $5 \times 10^{-4}$ to $10^{-6}$ Pa, and more preferably $10^{-4}$ to $10^{-5}$ Pa, and at a substrate temperature usually in a range of 25 to 500° C., preferably 50 to 300° C., and more preferably 100 to 250° C.

An inert gas such as Ne, Ar, Kr, Xe and the like can be usually used as an introduced gas. Of these, Ar is preferable from the viewpoint of a high film-forming speed. In the case in which the ratio of zinc to tin is less than 1 (Zn/Sn<1), inclusion of oxygen in the introduced gas in an amount of 0.01 to 5% is preferable because of easy reduction of the specific resistance. When the ratio of zinc to tin is more than 2 (Zn/Sn>2), inclusion of hydrogen in the introduced gas in an amount of 0.01 to 5% is preferable because of easy reduction of the resistance of the transparent conductive film.

The transparent conductive film of the first aspect is preferably amorphous or microcrystalline, with the amorphous transparent conductive film being particularly preferable. Whether the transparent conductive film of the first aspect is amorphous or not can be confirmed by the X-ray diffraction method. An amorphous transparent conductive film ensures easy etching while suppressing production of etching residue. In addition, a uniform film can be obtained even if the area is large.

The etching rate of the transparent conductive film with 45° C. oxalic acid is usually in a range of 20 to 1,000 nm/min, preferably 50 to 300 nm/min, more preferably 60 to 250 nm/min, and particularly preferably 80 to 200 nm/min. If less than 20 nm/min, not only the tact time may be retarded, but also etching residues may remain. An etching rate of more than 1,000 nm/min is too fast to control the line width and the like, resulting in fluctuation.

It is desirable for the transparent conductive film of the first aspect to have resistance to PAN which is a metal wiring etching solution. If the transparent conductive film is resistant to PAN, it is possible to etch the metal wiring without melting the transparent conductive film after forming a metal wiring material film on the transparent conductive film. The PAN resistance is preferably etching with PAN at 50° C. at a rate of 20 nm/min or less, and more preferably 10 nm/min or less.

The transparent conductive film of the first aspect has a specific resistance of preferably 1,800 μΩ·cm or less, more preferably 1,300 μΩ·cm or less, and particularly preferably 900 μΩ·cm or less.

The specific resistance of the transparent conductive film can be measured by the four probe method.

The thickness of the transparent conductive film of the first aspect is usually 1 to 500 nm, preferably 10 to 240 nm, more preferably 20 to 190 nm, and particularly preferably 30 to 140 nm. If the thickness is larger than 500 nm, there is a possibility that the film partly crystallizes or it takes a long time to form the film; if smaller than 1 nm, the film may be affected by the substrate and may have high specific resistance. The thickness of the transparent conductive film can be measured by the stylus method.

IV. Transference Electrode

The transparent electrode of the first aspect is prepared by etching the transparent conductive film of the first aspect.

Because the transparent electrode of the first aspect is prepared from the transparent conductive film of the first aspect, the transparent electrode of the first aspect has the above properties of the transparent conductive film of the first aspect.

There are no specific limitations to the method for etching to prepare the transparent electrode of the first aspect. A suitable etching solution, etching method, and etching conditions can be selected according to the purpose and situation.

An etched edge has a taper angle in a range of preferably 35 to 89°, more preferably 40 to 87°, and particularly preferably 45 to 85°. If the taper angle is less than 35°, the tapered parts may be too large. There is a possibility of a reduced open aperture ratio and a short circuit. If more than 89°, the etched edge is reversely tapered. There is a possibility of lowered durability and malfunctioning of panels.

The taper angle at the electrode edge can be measured by observing the cross-section using a scanning electron microscope (SEM).

According to the first aspect, a sputtering target with a low resistance, a high theoretical relative density, and a high strength can be provided.

In addition, a transparent conductive film having excellent conductivity, etching properties, heat resistance, and the like and exhibiting resistance to PAN (a mixture of phosphoric acid, acetic acid, and nitric acid) can be provided.

A second aspect of the invention is described below.

I. Sputtering Target (I-1) Constitution of Sputtering Target

The sputtering target of the second aspect (hereinafter referred to as "target of the second aspect") is characterized by comprising indium, tin, zinc, and oxygen, and only a peak, ascribed to a bixbyite structure compound is substantially observed by X-ray diffraction (XRD).

The bixbyite structure compound is as previously described in the first aspect.

"Only a peak ascribed to a bixbyite structure compound is substantially observed by X-ray diffraction (XRD)" means that a peak pattern of No. 06-0416 ($In_2O_3$ single crystal powder) or an analogous (shifted) pattern of the Joint Committee on Powder Diffraction Standards (JCPDS) database is observed by X-ray diffraction, with the maximum peaks of other structures being sufficiently small, i.e. 5% or less of the maximum peak of the bixbyite structure compound, or not substantially observed.

In addition, it is preferable that the peaks of $SnO_2$ or $Sn_3In_4O_{12}$ observed by X-ray diffraction be sufficiently small, i.e. 3% or less of the maximum peak of the bixbyite structure compound, or not substantially observed. These compounds, if included, may increase the resistance of the target, tends to easily generate charges on the target during sputtering, and may cause abnormal electrical discharge or produce nodules.

In the target of the second aspect, it is preferable that the atomic ratio of In/(In+Sn+Zn) be in a range larger than 0.6 and smaller than 0.75, and the atomic ratio of Sn/(Sn+Zn) be in a range of 0.11 to 0.23.

The atomic ratio of In/(In+Sn+Zn) is shown by the inequality formula of 0.6<In/(In+Sn+Zn)<0.75, and does not include 0.6 and 0.75.

On the other hand, the atomic ratio of Sn/(In+Sn+Zn) is shown by the formula 0.11≤Sn/(In+Sn+Zn)≤0.23, and includes 0.11 and 0.23.

If the atomic ratio of In/(In+Sn+Zn) is 0.6 or less, the mono layer structure of the bixbyite structure compound may become unstable and may produce other types of crystals; if 0.75 or more, the film produced by sputtering may be easily crystallized, the etching rate may become slow, and residues may be left after etching. In addition, indium reduction may be insufficient. The atomic ratio of In/(In+Sn+Zn) is more preferably in a range of 0.61 to 0.69, and still more preferably 0.61 to 0.65.

If the atomic ratio of Sn/(In+Sn+Zn) is less than 0.11, the resistance of the target may increase due to production of the hexagonal layered compound of $In_2O_3(ZnO)_m$, wherein m is an integer of 2 to 20, and ZnO; if larger than 0.23, $Sn_3In_4O_{12}$, $SnO_2$, SnO, and the like may be produced, which may result in an increase of resistance and generation of nodules.

The atomic ratio of Sn/(In+Sn+Zn) is preferably in a range of 0.11 to 0.21, more preferably 0.11 to 0.19, and still more preferably 0.12 to 0.19.

The atomic ratio of Zn/(In+Sn+Zn) is preferably in a range of 0.03 to 0.3, more preferably 0.06 to 0.3, and particularly preferably 0.12 to 0.3. If the atomic ratio of Zn/(In+Sn+Zn) is less than 0.03, etching residue may remain; if more than 0.3, the heat resistance under atmosphere may be impaired and the film forming rate may decrease.

The above atomic ratios of the target of the second aspect can be measured by inductively coupled plasma (ICP) spectrophotometry.

In the target of the second aspect, it is preferable that the peak position of the bixbyite structure compound to the peak position of the X-ray diffraction (XRD) of $In_2O_3$ powder shift toward the plus side (wide angle side). When shifting toward the plus side (wide angle side), the target is thought to have a short distance between gratings by solid-dissolution substitution of a cation having a smaller ionic radius than the indium ion. The peak position (pattern) of the X-ray diffraction (XRD) of $In_2O_3$ powder is disclosed in the Joint Committee on Powder Diffraction Standards (JCPDS) database No. 06-0416.

If the shift of the maximum peak position of the bixbyite structure compound is less than 0.1°, solid dissolution of other atoms in the bixbyite structure compound may become insufficient and other type crystals may be deposited.

The shift of the peak position of the bixbyite structure compound, in terms of the maximum peak position (2θ), is preferably 0.05° or more, more preferably 0.1° or more, and particularly preferably 0.2° or more.

The peak shift angle can be measured by analyzing the X-ray diffraction chart.

Figure 7:
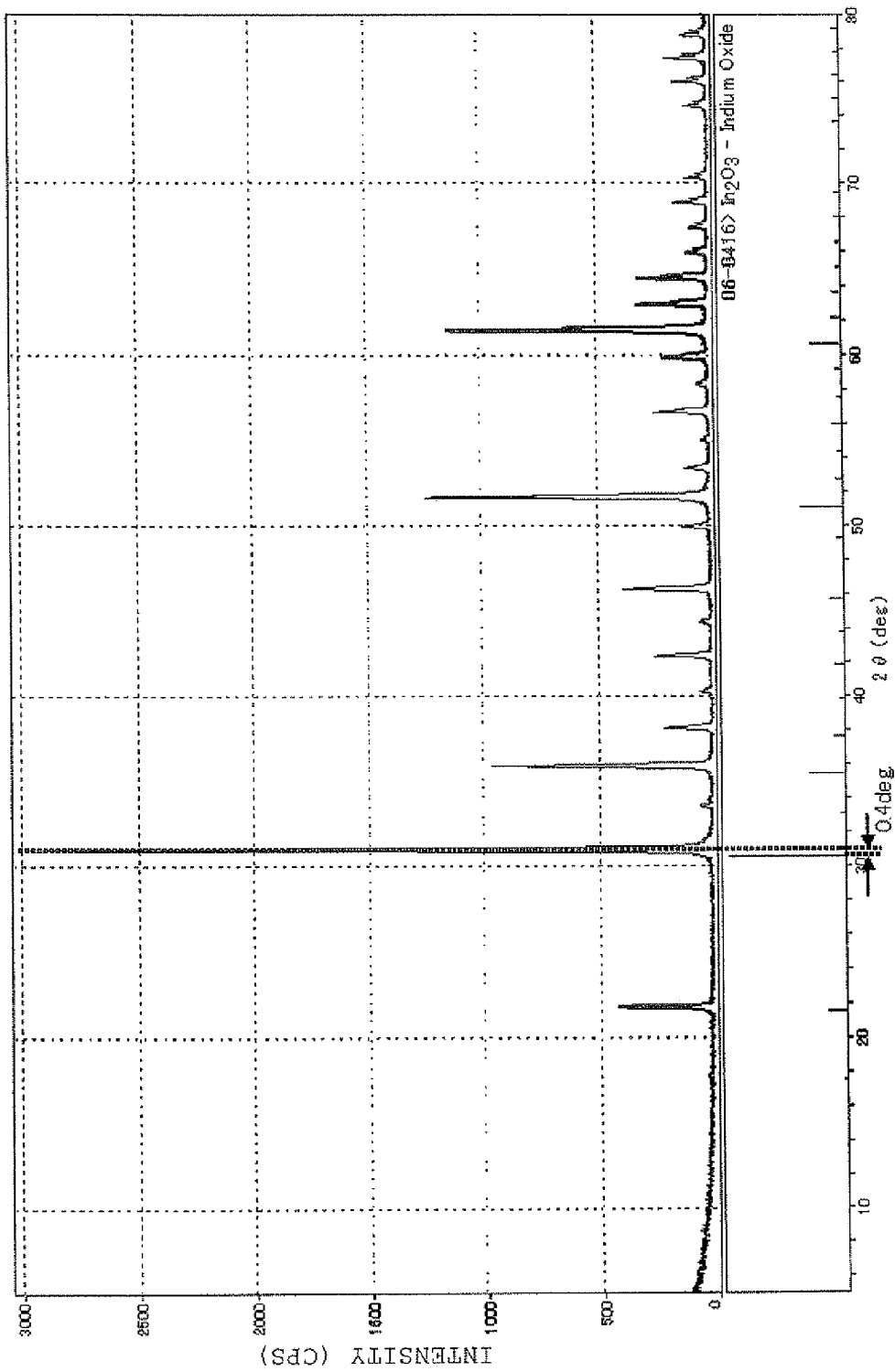
FIG. 7 is a drawing showing an X-ray diffraction chart of the target produced in Example 6.

FIG. 7 is a chart of the X-ray diffraction of the target of the second aspect produced in Example 6 mentioned later. The figure indicates that the shift of the maximum peak position of the bixbyite structure compound is 0.4°.

In the target of the second aspect, the average diameter of Zn aggregates observed by an electron probe micro analyzer (EPMA) is preferably 50 μm or less.

If the average diameter of the Zn aggregate is more than 50 μm, the area of the Zn aggregate serves as a stress concentration point, which may result in a decrease of strength, charge generation, and abnormal electrical discharge.

The average diameter of the Zn aggregate is more preferably 30 μm or less, and still more preferably 15 μm or less.

The ratio of the area of Zn aggregate to the target section area is usually 10% or less, preferably 5% or less, and particular preferably 1% or less.

The content of each of Cr and Cd in the target of the second aspect is preferably 10 ppm (by mass) or less.

Cr and Cd are impurities of the target of the second aspect. If the content of each is more than 10 ppm (by mass), these atoms may serve as nuclei of other types of crystals and it is difficult for the target to have a bixbyite structure. Moreover, when the formed film is used for a liquid crystal display device, there is a possibility of impairing durability and causing a burn-in phenomenon.

Excluding the Zn aggregate area, it is preferable that In, Sn, and Zn be distributed almost homogeneously.

The content of each of Cr and Cd is more preferably 5 ppm or less, and particularly preferably 1 ppm or less.

The content of each of Fe, Si, Ti, and Cu in the target of the second aspect is preferably 10 ppm (by mass) or less.

Fe, Si, Ti, and Cu are impurities of the target of the second aspect. If the content of each of these is more than 10 ppm (by mass), other types of crystals tend to be easily produced and it is difficult for the target to have a bixbyite structure.

The content of each of Fe, Si, Ti, and Cu is more preferably 5 ppm or less, and particularly preferably 1 ppm or less.

The content of the above impurity elements can be measured by inductively coupled plasma (ICP) spectrophotometry.

To the extent that the effect of the second aspect is not impaired, it is possible to add Mg, B, and Ga to improve the transmission rate, to add Al to improve heat resistance, and to add Zr to improve chemical resistance.

In the target of the second aspect, the diameter of the crystal particles of the bixbyite structure compound is preferably 20 μm or less.

If the crystal grain diameter of the bixbyite structure compound is more than 20 μm, the particle boundary serves as a stress concentration point, which may result in a decrease of strength and may easily impair smoothness of the target surface.

The diameter of the crystal particles of the bixbyite structure compound is more preferably 8 μm or less, and particularly preferably 4 μm or less.

The crystal grain diameter of the bixbyite structure compound can be measured using an electron probe micro analyzer (EPMA).

It is preferable that the target of the second aspect have a bulk resistance of 0.2 to 100 mΩ·cm.

If the bulk resistance is less than 0.2 mΩ·cm, the resistance may became lower than the resistance of the formed film and scattered film may produce nodules. If more than 100 mΩ·cm, sputtering may be unstable.

The bulk resistance of the target of the second aspect is more preferably in the range of 0.3 to 10 mΩ·cm, still more preferably 0.4 to 6 mΩ·cm, and particularly preferably 0.4 to 4 mΩ·cm.

The theoretical relative density of the target of the second aspect is preferably 90% or more. If the theoretical relative density of the target is less than 90%, the target may crack during discharge.

The theoretical relative density of the target of the second aspect is more preferably 94% or more, still more preferably 95% or more, and particularly preferably 98% or more.

The deflecting strength of the target of the second aspect is preferably 10 kg/mm$^2$ or more, more preferably 11 kg/mm$^2$ or more, and particularly preferably 12 kg/mm$^2$ or more. Transportation and installation of the target are as described in the section of the target of the first aspect. The target may be damaged due to the load applied during transportation and installation. For this reason, the target must have a deflecting strength of a degree not less than a certain level. If the deflecting strength is less than 10 kg/mm$^2$, the target may not be usable.

The method for measuring the bulk resistance, theoretical relative density, and deflecting strength of the target are as described in the section of the target of the first aspect.

(1-2) Production Method of Sputtering Target

The method for producing the sputtering target of the second aspect (hereinafter referred to from time to time as "production method of the target of the second aspect") comprises the steps of preparing a mixture of raw material compounds of indium, tin, and zinc at an atomic ratio of In/(In+Sn+Zn) in a range larger than 0.6 and smaller than 0.75, and an atomic ratio of Sn/(In+Sn+Zn) in a range of 0.11 to 0.23, press-molding the mixture to obtain a molded product, heating the molded product at a rate of 10 to 1,000° C./hour, firing the molded product at a temperature in a range of 1,100 to 1,700° C. to obtain a sintered body, and cooling the sintered body at a rate of 10 to 1,000° C./hour.

Each step of the production method of the target of the second aspect will be described below.

(1) Mixing Step

The mixing step is an essential step of mixing the raw material metal oxides of the sputtering target.

As the raw materials, a powder of an indium compound with a particle diameter of 6 μm or less, a powder of a zinc compound, and a powder of a tin compound having a particle diameter smaller than the particle diameters of the powders of the indium compound and the zinc compound are preferably used. If the particle diameter of the powder of the tin compound is equivalent to or larger than the particle diameters of the powders of the indium compound and the zinc compound, $SnO_2$ may remain in the target. $SnO_2$ remaining in the target may possibly make it difficult to produce a bixbyite structure and may increase the bulk resistance of the target.

In addition, it is preferable that the particle diameter of the powder of the tin compound be smaller than the particle diameters of the powders of the indium compound and the zinc compound. More preferably, the particle diameter of the powder of the tin compound is one half or less of the particle diameter of the powder of the indium compound. It is particularly preferable that the particle diameter of the powder of the zinc compound be smaller than that of the powder of the indium compound for easy production of the bixbyite structure.

It is preferable to homogeneously blend and pulverize the metal oxides used as the raw material for producing the target using a common mixer such as a wet ball mill or a bead mill or using an ultrasonic device.

Oxides of indium, tin, and zinc which are raw materials of the target must be incorporated at an atomic ratio of In/(In+Sn+Zn) in a range larger than 0.6 and smaller than 0.75, and the atomic ratio of Sn/(In+Sn+Zn) in a range of 0.11 to 0.23. If the ratios are outside the above ranges, the target of the second aspect having the above-mentioned effects cannot be obtained.

The indium compound is as described in the first aspect.

When pulverizing the metals oxides of the raw materials of the target, the particle diameter of the metal oxides after pulverization is usually 10 μm or less, preferably 3 μm or less, more preferably 1 μm or less, and still more preferably 0.1 μm. When the particle diameter of the metal oxides is too large, it may be difficult to increase the density of the target.

The particle diameters of the metal compounds used as the raw material of the target after pulverization can be measured according to JIS R1619.

(2) Prefiring Step

A prefiring step is optionally provided in order to preliminarily sinter the mixture of indium compounds, zinc compounds, and tin compounds used as the raw material of the target after preparation of such a mixture.

After obtaining a mixture of the indium compounds, zinc compounds, and tin compounds, it is preferable to preliminary fire the mixture. However, in the case of a large target such as that used for manufacturing a liquid crystal panel, the crystal type may not be stable. In such a case, the prefiring step is better omitted.

The heat treatment in the prefiring step is as described in the first aspect.

The prefired body obtained in this step is preferably pulverized before molding and sintering. The pulverization can be carried out in the same manner as described in the first aspect.

(3) Molding Step

The molding step is as described in the first aspect.

(4) Firing Step

The sintering step is an essential step to fire the molded product, which is obtained by granulating the fine powder obtained in the molding step and molding the powder into a desired shape by press-molding. The firing step includes the steps of heating the molded product obtained by the molding step at a temperature in a range of 10 to 1,000° C./hour, firing the molded product at a temperature in a range of 1,100 to 1,700° C. to obtain a sintered body, and cooling the sintered body at a cooling rate of 10 to 1,000° C./hour.

The firing can be carried out by hot isostatic press (HIP) firing and the like.

The firing is carried out at a temperature usually in a range of 100 to 1,700° C., preferably in a range of 1,260 to 1,640° C., more preferably in a range of 1,310 to 1,590° C., and particularly preferably in a range of 1,360 to 1,540° C., for a period of 30 minutes to 360 hours, preferably 8 to 180 hours, and more preferably 12 to 120 hours.

The firing is carried out in an oxygen atmosphere under oxygen pressure. If the raw material powder mixture is fired in an atmosphere not containing oxygen gas, gas components such as oxygen dissociate from the raw material during firing and may change the composition. If fired at a temperature of 1,700° C. or more, generation of a hexagonal layered compound may be predominant, production of bixbyite crystals may be insufficient and some of the components may gasify, making it difficult to control the component composition. If the temperature is lower than 1,100° C., the objective crystal forms may not be produced. There is a possibility that the sintered body density may not be increased, the target resistance may increase, and strength may decrease. If the sintering temperature is lower than 1,100° C., other crystal forms having high resistance may be produced. There is a possibility that the raw materials may remain and the relative density of the target may decrease. If the sintering time is shorter than 30 minutes, there is a possibility that the raw materials may remain and the relative density of the target may decrease.

The heating rate of the molded product is usually 10 to 1,000° C./hour, preferably 20 to 600° C./hour, and more preferably 30 to 300° C./hour. If the heating rate is more than 1,000° C./hour, a hexagonal layered compound may be produced, leading to insufficient formation of the bixbyite structure compound. The heating rate of less than 10° C./hour is too slow for production and may impair productivity.

The heating rate of the sintered body is usually 10 to 1,000° C./hour, preferably 15 to 600° C./hour, more preferably 20 to 300° C./hour, and particularly preferably 30 to 100° C./hour. If the heating rate is more than 1,000° C./hour, a hexagonal layered compound may be produced, leading to insufficient formation of the bixbyite structure and a risk of cracks being produced in the target. The heating rate of less than 10° C./hour is too slow for production and may impair productivity.

A cooling rate is preferably less than the heating rate. More preferably, a cooling rate is 60% or more, and particularly preferably 40% or more, less than the heating rate. A cooling rate smaller than the heating rate ensures production of an objected target in a comparatively short period of time.

(5) Reducing Step

The reducing step is as described in the first aspect.

(6) Working Step

A working step is optionally provided to cut the sintered body obtained by sintering in the above-mentioned manner into a form suitable for mounting on a sputtering apparatus and to attach a mounting jig such as a backing plate.

The thickness of the target is usually 2 to 20 mm, preferably 3 to 12 mm, and particularly preferably 4 to 6 mm. It is possible to attach two or more targets to one backing plate to obtain a single target in substance. The surface is finished preferably using any one of Nos. 80 to 10,000 diamond wheels, and more preferably using any one of Nos. 100 to 4,000 diamond wheels. Surface finishing using one of Nos. 200 to 1,000 diamond wheels is particularly preferable. If a diamond wheel with a smaller number than No. 80 is used, the target may be easily cracked.

Although the use of the above-mentioned production method of the target of the second aspect is preferable in order to produce the target of the second aspect, the method is not particularly limited insofar as the raw materials of the target with the above-mentioned particle size are mixed at the above-mentioned specific atomic ratio and processed under the above-mentioned sintering conditions specified for the firing step (heating rate, cooling rate, sintering temperature, and sintering time). The other steps can be carried out without particularly limitations. For example, common methods disclosed in JP-A-2002-69544, JP-A-2004-359984, and Japanese Patent No. 3628554, as well as the following methods can be used. A production method consisting of a combination of some of these methods may also be used.

Method of Manufacturing Sputtering Target for Industrial Use (1)

(i) Wet-blend and pulverize weighed raw materials together with water and adjuvants in a ball-mill, bead mill, etc.
(ii) Dry the resulting raw material mixture using a spray dryer, etc., and granulate to obtain a granule powder.
(iii) Press-mold the granule powder, followed by SIP molding using a rubber die.
(iv) Fire the molded product under oxygen pressure to obtain a sintered body.
(v) Cut the resulting fired body using a diamond cutter, water cutter, etc. and grind using a diamond wheel, etc.
(vi) Apply a wax agent such as metal indium, and secure the resulting target to a backing plate made of copper or the like.
(vii) Grind the backing plate to remove the wax agent, oxidized layer, etc. and treat the surface of the target.

Method of Manufacturing Sputtering Target for Industrial Use (2)

(i) Dry-blend and pulverize weighed raw materials in a ball mill or the like to obtain a granule powder.
(ii) Press-mold the resulting granular powder.
(iii) Sinter the molded product under atmospheric pressure to obtain a sintered body.

Method of Manufacturing Sputtering Target for Industrial Use (3)

(i) Dry-blend and pulverize weighed raw materials in a ball mill or the like to obtain a granule powder.
(ii) Wet-blend and pulverize the granule powder in a ball mill, V-blender, etc. to obtain a dispersion of granule powder.
(iii) Mold the dispersion of granule powder using a mold die to obtain a molded product.
(iv) Dry the molded product by causing contact with air on a supporting body, and fire under atmospheric pressure to obtain a fired product.

II. Transparent Conductive Film (II-1) Constitution of Transparent Conductive Film The transparent conductive film of the second aspect is prepared by using the target of the second aspect by the sputtering method.

The transparent conductive film of the second aspect is preferably amorphous or microcrystalline, and particularly preferably amorphous. If the transparent conductive film is crystalline, the etching rate during preparation of a transparent electrode may be slow, residues may remain after etching, and the taper angle of the electrode terminals may not be within the range of 30° to 89° when a transparent electrode is produced.

It is desirable for the transparent conductive film of the second aspect to have resistance to PAN (a mixture of phosphoric acid, acetic acid, and nitric acid) which is a metal wiring etching solution. If the transparent conductive film is resistant to PAN, it is possible to etch the metal wiring without melting the transparent conductive film after forming a metal wiring material film on the transparent conductive film.

(II-2) Production Method of Transparent Conductive Film

The same sputtering method and sputtering conditions as explained in the first aspect are applicable to the production of the transparent conductive film of the second aspect.

The transparent conductive film of the second aspect excels in conductivity, etching performance, heat resistance, and the like even if the content of indium is reduced. Moreover, the transparent conductive film of the second aspect can be etched using a phosphoric acid etching solution which is an etching solution for a metal or an alloy. This offers an advantage that the transparent conductive film can be etched together with a metal or an alloy.

The transparent conductive film of the second aspect has a specific resistance of preferably 1,200 μΩ·cm or less, more preferably 900 μΩ·cm or less, and particularly preferably 600 μΩ·cm or less. If the specific resistance is more than 1,200 μΩ·cm, the film thickness must be increased in order to lower the resistance.

The specific resistance of the transparent conductive film can be measured by the four probe method.

The film thickness described in the first aspect is applicable to the film thickness of the transparent conductive film of the second aspect.

III. Transparent Electrode (III-1) Constitution of Transparent Electrode

The transparent electrode of the second aspect is prepared by etching the transparent conductive film of the second aspect. The transparent electrode of the second aspect has the above-mentioned characteristics of the transparent conductive film of the second aspect.

The electrode edge of the transparent electrode of the second aspect has a taper angle of preferably 30 to 89°, more preferably 35 to 85° and particularly preferably 40 to 80°. The taper angle at the electrode edge can be measured by observing the cross-section using a scanning electron microscope (SEM).

If the electrode edge has a taper angle of less than 30°, the length of the electrode edge portion becomes too long. When a liquid crystal panel or an organic electroluminescence panel is driven, there may be a difference of contrast between the pixel peripheral part and the inside. If the taper angle is more than 89°, the electrode may crack or delaminate at the edge portion, which may cause defects of an oriented film and breakage.

Since the taper angle of the electrode edge can be easily adjusted, the transparent electrode of the second aspect is particularly suitable for use on an organic film for which adjustment of the taper angle is difficult.

(III-2) Method of Preparation of Transparent Electrode

The method for forming a transparent electrode of the second aspect is characterized by etching the transparent conductive film of the second aspect using a 1 to 10 mass % oxalic acid aqueous solution at a temperature of 20 to 50° C. A more preferable concentration of oxalic acid in the oxalic acid-containing solution is 1 to 5 mass %.

According to the production method of the transparent electrode of the second aspect, it is preferable to prepare the transparent electrode so that the taper angle at the electrode edge portion may be 30° to 89°.

The etching rate when a formed transparent conductive film is etched by using a 5 mass % oxalic acid aqueous solution at 35° C. is usually 10 to 500 nm/min, preferably 20 to 150 nm/min, and particularly preferably 30 to 100 nm/min. If less than 10 nm/min, not only the tact time is retarded, but etching residues may remain on the resulting transparent electrode. An etching rate of more than 500 nm/min may be too fast to control the line width and the like.

If the transparent conductive film is resistant to PAN (a mixture of phosphoric acid, acetic acid, and nitric acid) which is a metal wiring etching solution, it is possible to etch the metal wiring without melting the transparent conductive film after forming a metal wiring on the transparent conductive film. The PAN resistance allows etching with the PAN at 50° C. at a rate of preferably 20 nm/min or less, and more preferably 10 nm/min or less.

According to the second aspect, a sputtering target with low resistance, high theoretical relative density, and high strength can be provided.

According to the second aspect, there can be provided a target capable of performing stable sputtering while suppressing abnormal electrical discharge generated when forming a transparent conductive film by the sputtering method, even if the indium content is reduced.

According to the second aspect, a transparent conductive film excelling in conductivity, etching properties, heat resistance, and the like, and suitable for various applications such as a display represented by a liquid crystal display, a touch panel, and a solar cell, can be provided, even if the content of indium is reduced in the film formed by the sputtering method for the target of the present invention.

The third aspect of the invention is described below.

The transparent conductive film of the third aspect comprises amorphous oxides of indium (In), zinc (Zn), and tin (Sn). When the atomic ratio of Sn to In, Zn, and Sn is 0.20 or less, In, Zn, and Sn satisfy the following atomic ratio formulas.

$$0.50 < In/(In+Zn+Sn) < 0.75$$

$$0.11 < Sn/(In+Zn+Sn) \leq 0.20$$

$$0.11 < Zn/(In+Zn+Sn) < 0.34$$

The atomic ratio of indium (In/(In+Zn+Sn)) is preferably 0.54 to 0.67, more preferably 0.55 to 0.66, and particularly preferably 0.56 to 0.65. If 0.50 or less, the specific resistance may increase and durability of the tape carrier package (TCP) connections may decrease when using the target as an electrode. If 0.75 or more, the etching rate, when etched with an etching solution containing nitric acid, may decrease, residues may be left after etching, adjustment of a taper angle may be difficult, adhesion to a metal or an alloy may become poor, and the ratio of the etching rate B when etched with an etching solution containing oxalic acid to the etching rate A when etched with an etching solution containing phosphoric acid (B/A) may decrease.

The atomic ratio of tin (Sn/(In+Zn+Sn)) is preferably 0.12 to 0.20, more preferably 0.13 to 0.19, and particularly preferably 0.16 to 0.19. If 0.11 or less, the etching rate may become too high, making it difficult to control the etching work, the specific resistance may unduly increase if treated with heat in the presence of oxygen, and durability of TCP connections may decrease.

The atomic ratio of zinc (Zn/(In+Zn+Sn)) is preferably 0.18 to 0.34, more preferably 0.20 to 0.34, and particularly preferably 0.20 to 0.30. If 0.11 or less, the etching rate may decrease, residues may be left after etching, and adhesion to a metal or an alloy may become poor. If 0.34 or more, the specific resistance may unduly increase if treated with heat in the presence of oxygen and durability of TCP connections may decrease.

When the atomic ratio of Sn to In, Zn, and Sn is more than 0.20, In, Zn, and Sn satisfy the following atomic ratio formulas.

$0.30<\text{In}/(\text{In}+\text{Zn}+\text{Sn})<0.60$ $0.20<\text{Sn}/(\text{In}+\text{Zn}+\text{Sn})<0.25$ $0.14<\text{Zn}/(\text{In}+\text{Zn}+\text{Sn})<0.46$ The atomic ratio of indium (In/(In+Zn+Sn)) is preferably 0.35 to 0.55, and more preferably 0.40 to 0.52. If 0.30 or less, the specific resistance may increase and durability of TCP connections may decrease. If 0.60 or more, the etching rate may decrease when a nitric acid-containing etching solution is used, residues may be left after etching, and in-plane distribution of the etching rate may increase.

The atomic ratio of tin (Sn/(In+Zn+Sn)) is preferably 0.21 to 0.24, and more preferably 0.21 to 0.23. If 0.25 or more, the etching rate may decrease when a nitric acid-containing etching solution is used, residues may be left after etching, and adhesion to a metal or an alloy may be impaired.

The atomic ratio of zinc (Zn/(In+Zn+Sn)) is preferably 0.15 to 0.45. If 0.14 or less, the etching rate may decrease, residues may be left after etching, and adhesion to a metal or an alloy may become poor. If 0.46 or more, the specific resistance may unduly increase when treated with heat in the presence of oxygen and durability of TCP connections may decrease.

To the extent that the effect of the third aspect is not adversely affected, the sputtering target of the third aspect may contain, aluminum, gallium, magnesium, boron, germanium, niobium, molybdenum, tungsten, yttrium, antimony, hafnium, tantalum, calcium, beryllium, strontium, cesium, lanthanoids, and the like in addition to indium, tin, and zinc.

When preparing an electrode substrate containing a transparent conductive film and a metal or alloy layer, it is preferable that the transparent conductive film of the third aspect be easily etched with an etching solution for etching a transparent conductive film, but hardly etched with an etching solution for etching a metal or an alloy. Specifically, it is preferable that the etching rate of the etching solution for etching a transparent conductive film be higher than the etching rate of the etching solution for etching a metal or an alloy.

Usually, an etching solution containing a carboxylic acid such as oxalic acid is used as the etching solution for etching a transparent conductive film, and an etching solution containing an oxo acid such as phosphoric acid is used as the etching solution for etching a metal or an alloy.

In the transparent conductive film of the third aspect, the ratio B/A, which is a ratio of the etching rate (B) when etched with an etching solution containing oxalic acid to the etching rate (A) when etched with an etching solution containing phosphoric acid, is 10 or more.

The ratio B/A is preferably 15 to 100,000, and more preferably 20 to 10,000. If less than 10, a part of the transparent electrode film where exposed to an etching solution during etching of a metal or an alloy may become thin, or the surface may be roughened.

If more than 10,000, the control of the etching rate and taper angle may become difficult.

As an etching solution containing phosphoric acid, a mixed acid of phosphoric acid, nitric acid, and acetic acid is preferable, with a more preferable etching solution containing 20 to 95 wt % of phosphoric acid, 0.5 to 5 wt % of nitric acid, and 3 to 50 wt % of acetic acid. The etching solution may further contain a surfactant in addition to these acids. As the surfactant, an anionic surfactant or a nonionic surfactant is preferable, and the anionic surfactant is more preferable. As the surfactant, an anionic surfactant or a nonionic surfactant is preferable, and the anionic surfactant is more preferable.

The content of oxalic acid in the etching solution containing oxalic acid is preferably 0.5 to 20 wt %. The etching solution may contain dodecylbenzenesulfonic acid, polyoxyethylene phosphate, polysulfonic acid compound and the like. Furthermore, in order to improve wettability to the surface of each layer of the multilayer film which is to be etched, a surfactant may be included. As the surfactant, an anionic surfactant or a nonionic surfactant is preferable, and the anionic surfactant is more preferable.

As examples of the anionic surfactant, fluorine-based surfactants such as "Ftergent 110" (manufactured by Neos Co., Ltd.) and "EF-104" (manufactured by Mitsubishi Materials Corp.), nonfluorine-based surfactants such as "Persoft SF-T" (manufactured by NOF Corp.), and the like can be given.

As examples of the nonionic surfactant, fluorine-based surfactants such as "EF-122A" (manufactured by Mitsubishi Materials Corp.), nonfluorine-based surfactants such as "Ftergent 250" (manufactured by Neos Co., Ltd.), and the like can be given.

The etching temperature is preferably 20 to 50° C.

The etching rate at 35° C. of the etching solution containing oxalic acid is preferably 10 to 1,000 nm/min, more preferably 20 to 500 nm/min, still more preferably 25 to 300 nm/min, and particularly preferably 50 to 200 nm/min. If less than 10 nm/min, productivity may be decreased. If more than 1,000 nm/min, there is a possibility that the taper angle and line width cannot be controlled.

The transparent conductive film of the third aspect can be used as a transparent electrode. The end of the transparent electrode prepared by etching with an etching solution containing oxalic acid has a taper angle of preferably 30 to 89°. The taper angle is more preferably 35 to 89°, and particularly preferably 40 to 85°.

The taper angle can be controlled by the concentration of the etching solution and etching temperature. The etching temperature is preferably 15 to 55° C., more preferably 20 to 50° C., and particularly preferably 25 to 45° C. If the etching temperature is less than 15° C., the etching rate may become too small and there is a possibility for generating dew condensation in equipments. If more than 55° C., water may vaporize and the concentration of the etching solution is fluctuated.

The transparent conductive film and the transparent electrode of the third aspect may be formed not only on an inorganic material such as glass or an inorganic insulation film, but also on an organic substrate or an organic film such as a polyimide resin, an acrylic resin, an epoxy resin, a silicon resin, a polycarbonate resin, and a polystyrene resin. Unlike the crystalline membrane such as polycrystal ITO and the like, the transparent conductive film and the transparent electrode of the third aspect are free from a risk of producing crystalline unevenness on an organic substrate or an organic film. Thus, the transparent conductive film and the transparent electrode are preferably used on an organic substrate or an organic film. Therefore, the transparent conductive film and the transparent electrode of the third aspect are preferable as a transparent conductive film and a transparent electrode used on an organic flattened film such as FSP (field shield pixel).

In the transparent electrode of the third aspect, the atomic ratio of tin and zinc (Sn/Zn) in the connection section (contact point surface) with other conductors, such as a connector (terminal) area with the outside, is preferably 0.25 to 0.95, more preferably 0.35 to 0.9, still more preferably 0.45 to 0.85, and particularly preferably 0.55 to 0.85. If less than 0.25, the connection resistance may be excessive or increases after a humidity test. If more than 0.95, etching may become unstable. The atomic ratio of tin and zinc (Sn/Zn) can be measured by spectral analysis (ESCA).

Moreover, in the transparent electrode of the third aspect, the atomic ratio of zinc (Zn/(Zn+Sn+In)) in the connection section (contact point surface) with other conductors is preferably 0.01 to 0.35, more preferably 0.01 to 0.25, still more preferably 0.01 to 0.15, and particularly preferably 0.05 to 0.15. If less than 0.01, the etching rate may become low. If more than 0.35, the connection resistance such as TCP connection may become too large. The zinc atom ratio can be adjusted by a treatment after film formation, the conditions of the film formation, and the target composition. As the treatment after film formation, a heat-treatment, laser abrasion, and the like may be used. The zinc atom ratio can be measured by spectral analysis (ESCA).

The electrode substrate of the third aspect preferably comprises the transparent electrode made of the transparent conductive film of the third aspect and a layer of a metal or an alloy provided on the transparent electrode in contact therewith. The layer of a metal or an alloy functions as an auxiliary electrode.

The metal or alloy in contact with the transparent electrode comprises an element selected from the group consisting of Al, Ag, Cr, Mo, Ta, and W, and more preferably comprises Al, Ag, or Mo. These metals may be a single substance or an alloy containing these metals as a main component. As examples, Ag—Pd—Cu, Ag—Nd, Al—Nd, Al—Nb, Al—Ni, Al—Ti, Al—Ta, and the like can be given.

The electrode substrate of the third aspect is suitable for a display panel with an active matrix structure and the like, particularly for a TFT liquid crystal panel. In particular, the electrode substrate can be suitably used for semi-transmissive semi-reflective liquid crystals, VA mode panels, IPS mode panels, OCB mode panels, and FFS mode panels. The electrode substrate can also be used for TN system panels and STN system panels without any problem.

Regarding the TPC connection stability of the transparent conductive film of the third aspect, the increase rate of the resistance before and after a pressure cooker text (PCT) of the TCP connection using an anisotropic conductive film (ACF) is preferably 500% or less, more preferably 300% or less, and particularly preferably 150% or less.

If more than 500%, the electrode may cause failures such as nonuniform display in a display of a cellular phone used under a stringent circumstance.

Connection with the outside is not particularly limited to the TPC connection, but includes other methods of connection such as a chip on glass (COG) connection and chip on film (COF) connection.

The method for producing the electrode substrate of the third aspect comprises a step of stacking a transparent conductive film, a step of etching the transparent conductive film with an etching solution for a transparent conductive film, a step of stacking layers of a metal or an alloy at least on a part of the transparent conductive film, a step of etching the layers of the metal or alloy with an etching solution for etching a metal or an alloy.

As the etching solution for etching a transparent conductive film, an etching solution containing a carboxylic acid such as oxalic acid can be used. As the etching solution for etching a metal or an alloy, an etching solution containing an oxo acid such as phosphoric acid can be used.

As the carboxylic acid, a dicarboxylic acid is preferable, and oxalic acid is particularly preferable. As the oxo acid, an inorganic oxo acid is preferable, an inorganic oxo acid containing phosphorus is more preferable, and phosphoric acid is particularly preferable.

According to the third aspect of the invention, a transparent conductive film which has excellent adhesion to a metal or an alloy and can be selectively etched relative to a metal or an alloy can be provided.

According to the third aspect of the invention, a transparent conductive film exhibiting a small increase in resistance during a heat treatment in the atmosphere and a small resistance distribution in a large area can be provided.

According to the third aspect of the invention, a transparent electrode and an electrode substrate formed of these transparent conductive films can be provided.

According to the third aspect of the invention, a simplified method for producing an electrode substrate using these transparent conductive films can be provided.

EXAMPLES

The invention is described below in more detail by examples. However, the invention is not limited to these examples.

Example 1

(1) Production and Evaluation of Sputtering Target (i) Production of Target

As raw materials for the target, indium oxide with an average particle diameter of 3.4 μm and a purity of 4N, zinc oxide with an average particle diameter of 0.6 μm and a purity of 4N, and tin oxide with an average particle diameter of 0.5 μm and a purity of 4N were mixed at atomic ratios of In/(In+Sn+Zn)=0.53, Sn/(In+Sn+Zn)=0.17, and Zn/(In+Sn+Zn)=0.30. The mixture was supplied to a wet-type ball mill and pulverized for 72 hours to obtain a raw material fine powder.

The resulting fine powder of the raw materials was granulated, and the granules were press-molded to obtain a molded article with a diameter of 10 cm and a thickness of 5 mm. The molded article was put into a firing kiln and fired at 1,400° C. under oxygen pressure for 48 hours to obtain a sintered body (target). The temperature was increased at a rate of 3° C./rain during firing.

(ii) Evaluation of Target

The theoretical relative density, bulk resistance, X-ray diffraction analysis, crystal grain diameter, and various properties of the resulting target were measured. The X-ray diffraction chart obtained is shown in FIG. 1.

The theoretical relative density of the resulting target was 97%, and the bulk resistance measured by the four probe method was 1.3 mΩ·cm.

The elementary analysis by ICP spectrometry confirmed the atomic composition of In/(In+Sn+Zn)=0.53, Sn/(In+Sn+Zn)=0.17, and Zn/(In+Sn+Zn)=0.30.

The crystal state in the transparent conductive film material was observed by the X-ray diffraction method using a sample collected from the sintered body. As a result, only the spinel structure compound of $Zn_2SnO_4$ and the bixbyite structure compound of $In_2O_3$ were observed.

As shown in FIG. 1, the maximum peak of the spinel structure compound shifted by 0.3° to the narrow angle side, and the maximum peak of the bixbyite structure compound shifted by 0.3° to the wide angle side.

The measuring conditions of the X-ray-diffraction measurement (XRD) of the target were as follows.

Device: "Ultima-III" manufactured by Rigaku Corp.
X rays: Cu—Kα ray (wavelength; 1.5406 Å, monochromized by a graphite monochromator)
2θ-θ reflection method, continuous scan (1.0°/min)
Sampling interval: 0.02°
Slit DS, SS: 2/3°, RS: 0.6 mm.

Figure 5:
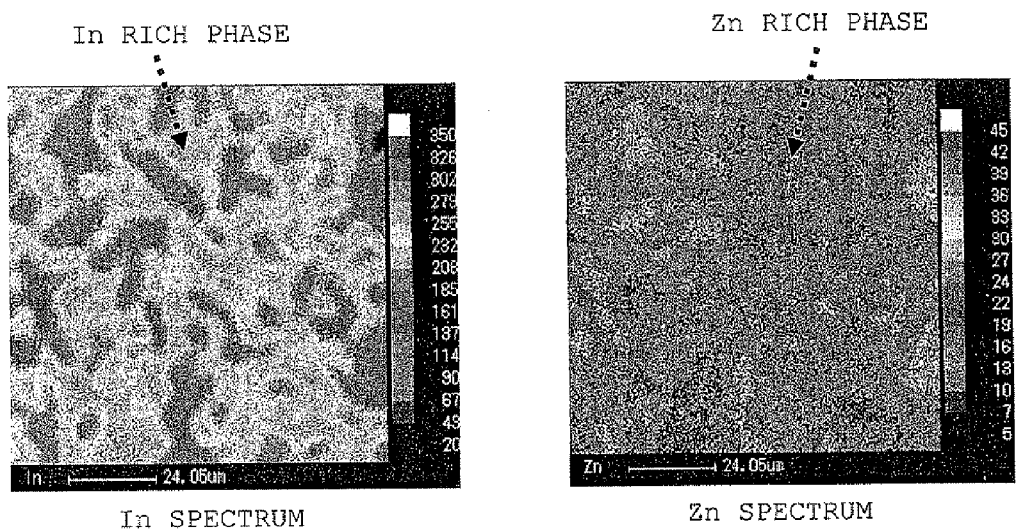
FIG. 5 shows an elementary analysis image of the target cross-section of the target produced in Example 1 taken by an electron probe micro analyzer (EPMA).

In addition, the resulting sintered body was enveloped in a resin. After grinding with alumina particles with a particle diameter of 0.05 μm, the surface was inspected by an electron probe micro analyzer (SPMA) ("EPMA-2300" manufactured by Shimadzu Corp.) under the following conditions.
Accelerating voltage: 15 kV
Sample current: 0.05 μA
Beam Size: 1 μm
Step Size: 0.2×0.2 μm As a result of measurement under the above conditions, the sintered body was confirmed to have a distinct sea-island structure of the indium (In) rich phase and the zinc (Zn) rich phase as shown in FIG. 5, and the ratio of the areas S (In) and S(Zn) calculated from each image, S(Zn)/S(In), was 0.9.

Furthermore, the sintered body was enveloped in a resin, and the surface was ground using alumina particles with a particle diameter of 0.05 μm and observed by an electron probe micro analyzer (EPMA) ("JXA-8621MX" manufactured by JEOL Ltd.) to measure the maximum diameter of the crystal particles of the spinel compound observed in a 30 μm×30 μm square frame on the surface of the sintered body enlarged to a magnification of 5,000 times. The average value of the maximum particle diameters measured in the same manner in three frames was calculated to confirm that the crystal grain diameter of the spinel structure compound of $Zn_2SnO_4$ and the bixbyite structure compound of $In_2O_3$ of the sintered body was 3.0 μm.

The sintered body obtained in (i) above was cut and processed with a No. 400 diamond wheel to prepare a sputtering target with a diameter of about 10 cm and a thickness of about 5 mm. The deflecting strength of the target was measured to show that the deflecting strength was 13 kg/mm². The deflecting strength was measured according to JIS R 1601.

(2) Preparation and Evaluation of Transparent Conductive Film (i) Preparation of Transparent Conductive Film The sputtering target obtained in (1) (i) above was mounted on a DC magnetron sputtering apparatus to prepare a transparent conductive film on a glass plate at room temperature.

The sputtering was carried out under the conditions of a sputtering pressure of $1 \times 10^{-1}$ Pa, an ultimate pressure of $5 \times 10^{-4}$ Pa, a substrate temperature of 200° C., electrical power of 120 W, and a film forming time of 15 minutes, while using 100% argon as an introduced gas.

As a result, a transparent conductive glass consisting of a glass substrate and a transparent conductive oxide with a thickness of about 100 nm formed on the glass substrate was obtained.

(ii) Evaluation of Sputtering State

The sputtering target obtained in (1) (i) above was mounted on a DC magnetron sputtering apparatus and sputtered under the same conditions as in (2) (i) above, except that a mixed gas of argon gas and 3% hydrogen gas was used as the introduced gas. Occurrence of abnormal electrical discharge was monitored during the sputtering to confirm that no abnormal electrical discharge occurred during continuous sputtering for 240 hours.

In Table 1, the occurrence of abnormal electrical discharge is indicated by "Yes" and nonoccurrence is indicated by "No".

(iii) Evaluation of Nodule Production

Sputtering was carried out continuously for eight hours using the sputtering target obtained in (1) (i) under the same conditions as in (2) (ii) above. The surface of the target after sputtering was observed with a stereomicroscope at a magnification of 30 times. The number of nodules with a size of 20 μm or more produced in 900 mm² visual fields, each encircled by three arbitrary points on the target, was counted and the average was calculated.

(iv) Evaluation of Properties of Transparent Conductive Film

To evaluate the electric conductivity of the transparent conductive film on the transparent conductive glass obtained in (2)(i) above, the specific resistance was measured by the four probe method to show that the specific resistance was $4 \times 10^{-4}$ Ω·cm (400 μΩ·cm).

The transparent conductive film was confirmed to be amorphous by X-ray diffraction analysis.

The measuring conditions of the X-ray-diffraction measurement (XRD) of the transparent conductive film were as follows.
Device: "Ultima-III" manufactured by Rigaku Corp.
X rays: Cu—Kα ray (wavelength; 1.5406 Å, monochromized by a graphite monochromator)
2θ-θ reflection method, continuous scan (1.0°/min)
Sampling interval: 0.02°
Slit DS, SS: 2/3°, RS: 0.6 mm To evaluate smoothness of the film surface, the P-V value (according to ITIS B0601) was measured to indicate that the P-V value was 5 nm, indicating good smoothness.

To evaluate transparency of the transparent conductive film, transmission of a light with a wavelength of 500 nm was measured with a spectrophotometer to confirm that the light transmission was 90%, indicating excellent transparency of the film.

Furthermore, the transparent conductive film was etched with oxalic acid at 45° C. to show that the etching rate was 150 nm/min.

Moreover, the etching rate by PAN (mixed acid of nitric acid: 3.3 mass %, phosphoric acid: 91.4 mass %, and acetic acid: 10.4 mass %), which is a typical phosphoric acid type etching solution for metal wiring, was 20 nm/min or less at 50° C., indicating excellent PAN resistance. In Table 1, the results of PAN resistance evaluation are indicated as "Good" when the etching rate was 20 nm/min or less at 50° C., and as "Bad" when the etching rate was more than 20 nm/min at 50° C.

Examples 2 to 5 and Comparative Examples 1 to 7

Figure 2:
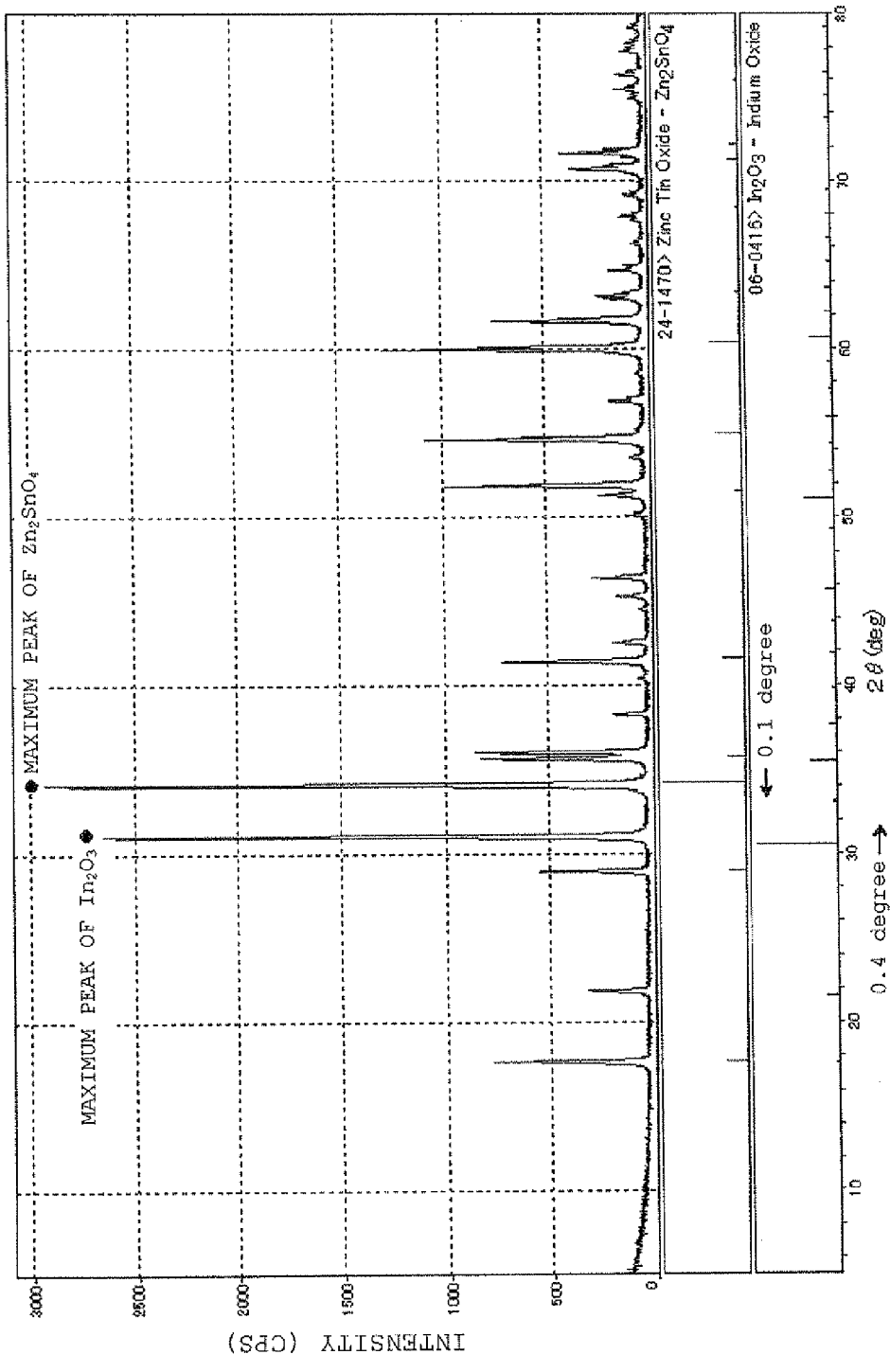
FIG. 2 is a drawing showing an X-ray diffraction chart of the target produced in Example 3.
Figure 3:
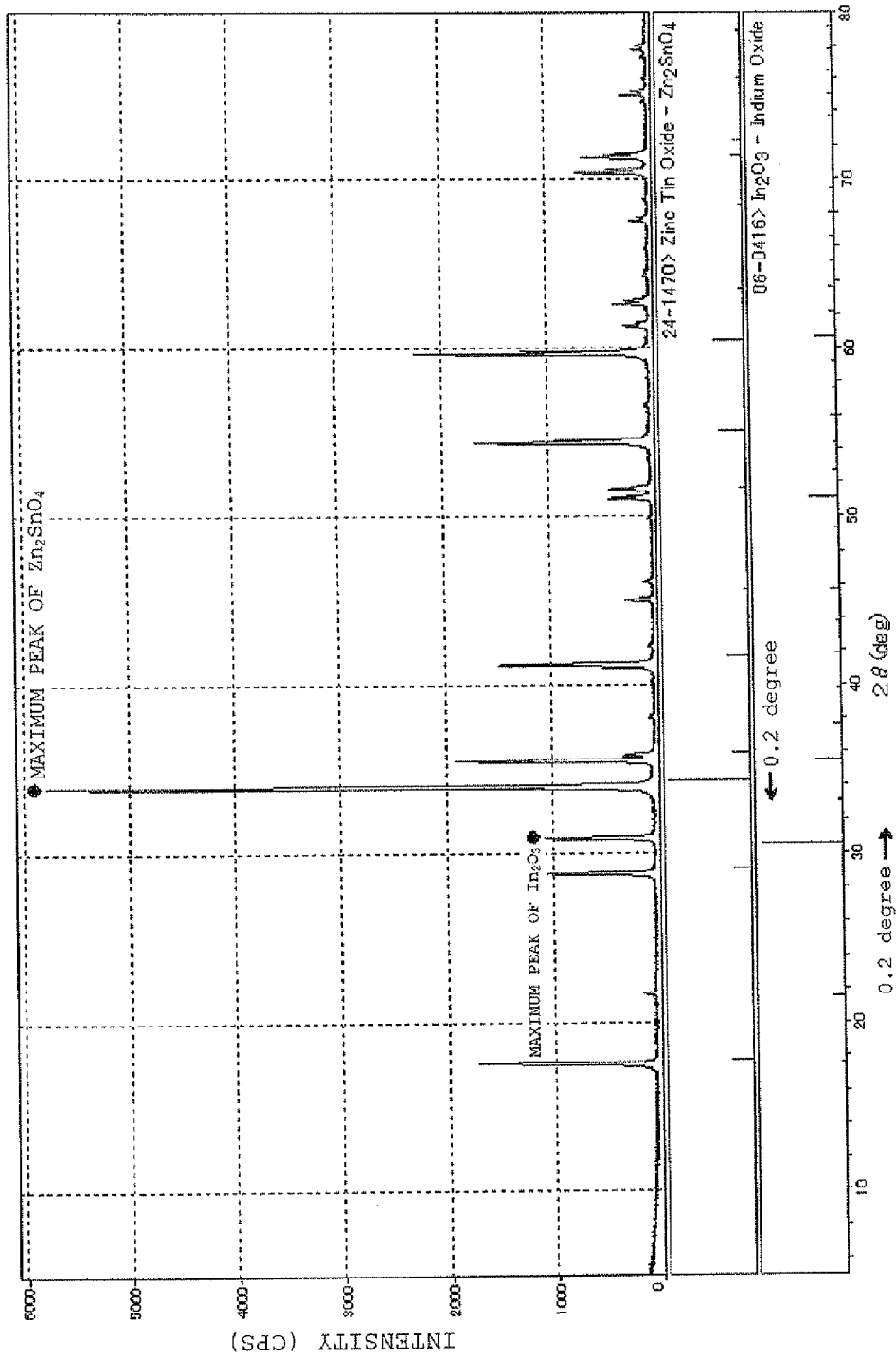
FIG. 3 is a drawing showing an X-ray diffraction chart of the target produced in Example 4.

The targets and the transparent conductive films were produced and evaluated in the same manner as in Example 1, except for changing the content ratio of the raw material metal oxides to make atomic ratios shown in Table 1. The results are shown in Table 1. X-ray diffraction charts of the targets obtained in Example 3 and Example 4 are respectively shown in FIGS. 2 and 3.

The image produced by measuring the sintered body obtained in Comparative Example 1 with an electron probe micro analyzer (EPMA) in the same manner as in Example 1 is shown in FIG. 6.

Since there is a possibility that stable discharge may not be attained by DC sputtering using the targets obtained in Comparative Examples 2, 4, and 5, these targets were used for RF sputtering.

TABLE 1

| Target (sintered body) | Example | | | | | Comparative Example | | | | | | |
|---|---|---|---|---|---|---|---|---|---|---|---|---|
| | 1 | 2 | 3 | 4 | 5 | 1 | 2 | 3 | 4 | 5 | 6 | 7 |
| Atomic ratio | | | | | | | | | | | | |
| In/(In + Sn + Zn) | 0.53 | 0.58 | 0.34 | 0.32 | 0.45 | 0.31 | 0.16 | 0.75 | 0.00 | 0.42 | 0.28 | 0.65 |
| Sn/(In + Sn + Zn) | 0.17 | 0.24 | 0.23 | 0.19 | 0.24 | 0.11 | 0.42 | 0.09 | 0.33 | 0.58 | 0.00 | 0.35 |
| Zn/(In + Sn + Zn) | 0.30 | 0.18 | 0.43 | 0.49 | 0.31 | 0.58 | 0.42 | 0.16 | 0.67 | 0.00 | 0.72 | 0.00 |
| Ratio of Zn/Sn | 1.76 | 0.75 | 1.87 | 2.59 | 1.29 | 5.47 | 1.00 | 1.85 | 2.00 | 0.00 | — | 0.00 |
| Sintering conditions | | | | | | | | | | | | |
| Sintering temperature | 1,400 | 1,400 | 1,400 | 1,400 | 1,400 | 1,400 | 1,400 | 1,400 | 1,400 | 1,400 | 1,400 | 1,400 |
| Sintering period | 48 | 48 | 48 | 48 | 48 | 48 | 48 | 48 | 48 | 48 | 48 | 48 |
| x-ray diffraction Crystal form | | | | | | | | | | | | |
| $In_2O_3$ (bixbyite) | Yes | Yes | Yes | Yes | Yes | | Yes | Yes | | Yes | | Yes |
| $Zn_2SnO_4$ (spinel) | Yes | Yes | Yes | Yes | Yes | Yes | | | Yes | | | |
| $SnO_2$ (rutile) | | | | | | | Yes | | | Yes | | Yes |
| ZnO (wurtzite) | | | | | | | | | | | Yes | |
| $In_2O_3(ZnO)_m$ (hexagonal layered compound) | | | | | | Yes | Yes | Yes | | | Yes | |
| $Sn_3In_4O_{12}$ | | | | | | | | | | | | Yes |
| Maximum peak ratio | 0.5 | 0.2 | 1.2 | 5.5 | 0.3 | — | — | — | — | — | — | — |
| Properties of target | | | | | | | | | | | | |
| $[I(Zn_2SnO_4)/I(In_2O_3)]$ | | | | | | | | | | | | |
| Theoretical relative density (%) | 97 | 95 | 100 | 100 | 99 | 85 | 79 | 87 | 78 | 60 | 72 | 63 |
| Bulk resistance (mΩ·cm) | 1.3 | 0.7 | 2.4 | 4.5 | 0.9 | 17 | 17,000 | 60 | 3,500 | 150 | 16 | 80 |
| Deflecting strength (kg/mm²) | 13 | 13 | 15 | 15 | 14 | 11 | 9 | 12 | 9 | 6 | 8 | 7 |
| Transparent conductive film Condition of sputter | | | | | | | | | | | | |
| Abnormal electrical discharge | No | No | No | No | No | No | No | No | No | Yes | No | Yes |
| Nodule (number of nodules/8 hr/90 mm²) | 0 | 0 | 0 | 0 | 0 | 0 | 0 | 0 | 0 | 48 | 0 | 32 |
| Properties of film | | | | | | | | | | | | |
| Specific resistance (μΩ·cm) | 400 | 400 | 850 | 900 | 600 | 1,100 | 4,000 | 400 | 40,000 | 20,000 | 3,000 | 10,000 |
| Crystallinity (X-ray diffraction) | Amorphous | Amorphous | Amorphous | Amorphous | Amorphous | Amorphous | Amorphous | Amorphous | Amorphous | Amorphous | Amorphous | Crystalline |
| Speed of etching with oxalic acid (nm/min, 45° C.) | 150 | 60 | 100 | 180 | 100 | 1,000 | Insoluble | 310 | insoluble | Insoluble | 10,000 | insoluble |
| PAN resistance | Good | Good | Good | Good | Good | Bad | Good | Bad | Good | Good | Bad | Good |

It can be seen from the results shown in Table 1 that the targets containing both the spinel structure compound of $Zn_2SnO_4$ and the bixbyite structure compound of $In_2O_3$ have a high theoretical relative density, low bulk resistance, and high deflecting strength.

In addition, the transparent conductive films formed by using the above-mentioned targets are free from abnormal electrical discharge, do not produce nodules, have a low specific resistance, exhibit a moderate oxalic acid etching rate, and possess PAN resistance.

Example 6

(1) Production of Sputtering Target

As raw materials for the target, indium oxide with a purity of 4N and an average particle diameter of 2 μm, zinc oxide with a purity of 4N and an average particle diameter of 0.6 μm, and tin oxide with a purity of 4N and an average particle diameter of 0.5 μm were mixed at atomic ratios of In/(In+Sn+Zn)=0.64, Sn/(In+Sn+Zn)=0.18, and Zn/(In+Sn+Zn)=0.18. The mixture was supplied to a wet-type ball mill and pulverized for 20 hours to obtain a raw material fine powder.

The resulting fine powder of the raw materials was granulated, and the granules were press-molded to obtain a molded article with a diameter of 10 cm and a thickness of 5 mm. The molded article was put into a firing kiln and fired at 1,400° C. under oxygen pressure for 48 hours to obtain a sintered body (target). The heating rate was 180° C./hr and the cooling rate was 60° C./hr.

(2) Evaluation of Target

The density, bulk resistance, X-ray diffraction analysis, crystal grain diameter, and various properties of the resulting target were measured. As a result, the theoretical relative density was 96%, and the bulk resistance measured by the four probe method was 0.6 mΩ·cm.

The crystal state in the transparent conductive film material was observed by the X-ray diffraction method using a sample collected from the sintered body. As a result, only the bixbyite structure compound was found in the target. In particular, no peak which belongs to $SnO_2$ or $Sn_3In_4O_{12}$ was found. The chart of X-ray diffraction of the resulting target is shown in FIG. 1.

The sintered body was then enveloped in a resin. The surface was ground with alumina particles with a particle diameter of 0.05 μm and observed with an electron probe micro analyzer (EPMA) ("JXA-8621MX" manufactured by JEOL Ltd.) to measure the maximum diameter of the crystal particles in a 30 μm×30 μm square frame on the surface of the sintered body at a magnification of 5,000 times. The average value of the maximum particle diameters measured in the same manner in three frames was calculated to confirm that the crystal grain diameter of the bixbyite structure compound was 2.5/μm.

Elemental analysis of the target confirmed that content of Cr and Cd was less than 1 ppm.

The sintered body obtained in (1) was cut to prepare a sputtering target with a diameter of about 10 cm and a thickness of about 5 mm. A transparent conductive film was prepared by sputtering using the resulting target.

3) Preparation of Transparent Conductive Oxide (Transparent Conductive Film

A transparent conductive glass consisting of a glass substrate and a transparent conductive oxide with a thickness of 100 nm formed on the glass substrate was obtained in the same manner as in Example 1(2)(i).

(4) Evaluation of Sputtering State (i) Number of Abnormal Electrical Discharge

Occurrence of abnormal electrical discharge was monitored using the sputtering target obtained in (1) in the same manner as in Example 1(2) (ii). No abnormal electrical discharge was found.

(ii) Number of Nodules Produced

The number of nodules was measured in the same manner as in Example 1(2)(iii) and the average was calculated.

(5) Evaluation of Properties of Transparent Conductive Film

To evaluate the electric conductivity of the transparent conductive film on the transparent conductive glass obtained in (3) above, the specific resistance was measured by the four probe method to show that the specific resistance was 500 μΩ·cm.

The transparent conductive film was confirmed to be amorphous by X-ray diffraction analysis. To evaluate smoothness of the film surface, the P-V value (conforming to JIS B0601) was measured to show that the P-V value was 5 nm, indicating good smoothness.

To evaluate transparency of the transparent conductive film, transmission of light with a wavelength of 500 nm was measured by a spectrophotometer to confirm that the light transmission was 90%, indicating excellent transparency of the film.

Furthermore, the transparent conductive film was etched with a 5 mass % oxalic acid solution at 35° C. to indicate that the etching rate was 80 nm/min.

In addition, the etching rate using the same PAN as used in Example 1 was 20 nm/min or less at 50° C., confirming excellent PAN resistance.

In Table 2, the results of PAN resistance evaluation are indicated by "Good" when the etching rate was 20 nm/min or less at 50° C., and by "Bad" when the etching rate was more than 20 nm/min at 50° C.

The measuring conditions of the X-ray-diffraction measurement (XRD) of the target were the same as in Example 1(2)(iv).

Examples 7 and 8 and Comparative Examples 8 to 10

Sputtering targets and transparent conductive films were produced and evaluated in the same manner as in Example 6, except for adjusting the raw material compositions to the atomic ratios shown in Table 2. RF magnetron sputtering was used for Comparative Example 8. The results of evaluation are shown in Table 2.

TABLE 2

|  |  |  | Example | | | Comparative Example | | |
|---|---|---|---|---|---|---|---|---|
|  | Target (sintered body) |  | 6 | 7 | 8 | 8 | 9 | 10 |
| Atomic | In/(In + Sn + Zn) |  | 0.64 | 0.67 | 0.71 | 0.08 | 0.64 | 0.64 |
| ratio | Sn/(In + Sn + Zn) |  | 0.18 | 0.16 | 0.14 | 0.46 | — | 0.36 |
|  | Zn/(In + Sn + Zn) |  | 0.18 | 0.17 | 0.15 | 0.46 | 0.36 | — |
|  | Zn/(Sn + Zn) |  | 0.50 | 0.52 | 0.52 | 0.50 | 1.00 | 0.00 |
| Sintering | Sintering temperature |  | 1,400 | 1,400 | 1,400 | 1,400 | 1,400 | 1,400 |
| conditions | Sintering period |  | 48 | 48 | 48 | 48 | 48 | 48 |
| X-ray | Crystal form | $In_2O_3$ | Yes | Yes | Yes | Yes | Yes | Yes |
| diffraction |  | $SnO_2$ |  |  |  | Yes |  | Yes |
|  |  | $Sn_3In_4O_{12}$ |  |  |  |  |  | Yes |
|  |  | $In_2O_3(ZnO)_3$ |  |  |  |  | Yes |  |
|  |  | $In_2O_3(ZnO)_{17}$ |  |  |  | Yes |  |  |

TABLE 2-continued

|  | Target (sintered body) | Example 6 | Example 7 | Example 8 | Comparative Example 8 | Comparative Example 9 | Comparative Example 10 |
|---|---|---|---|---|---|---|---|
| Properties of Target | Theoretical relative density (%) | 96 | 95 | 93 | 76 | 89 | 85 |
|  | Bulk resistance (mΩ · cm) | 0.6 | 0.6 | 0.6 | 200,000 | 5 | 200 |
|  | Deflecting strength (kg/mm$^2$) | 13 | 13 | 12 | 8 | 11 | 11 |
| Transparent conductive film |  |  |  |  |  |  |  |
| Condition of sputter | Abnormal electrical discharge | No | No | No | No | No | Yes |
|  | Nodule (number of nodules/ 8 hrs/90 mm$^2$) | 0 | 0 | 0 | 0 | 0 | 49 |
| Properties of film | Specific resistance (μΩ · cm) | 500 | 500 | 500 | 5,500 | 600 | 600 |
|  | Etching rate (35° C. oxalic acid, nm/min) | 80 | 90 | 100 | <5 | 200 | <5 |
|  | Crystallinity (X-ray diffraction) | Amorphous | Amorphous | Amorphous | Amorphous | Amorphous | Crystalline |
|  | PAN resistance | Good | Good | Good | Good | Bad | Good |

Example 9

A large target essentially consisting of a bixbyite structure compound with the same composition as Example 6 was produced, and an electrode for a liquid crystal display for television was prepared on an organic film by DC magnetron sputtering and oxalic acid etching. A lighting test of the resulting panel prepared by using the electrode was carried out to obtain a performance comparable to a panel in which the electrode was prepared by using ITO.

No failures such as burn-in occurred during continuous lighting for 10,000 hours.

Example 10

(1) Production of Sputtering Target

As raw materials for the target, indium oxide, zinc oxide, and tin oxide with a purity of 4N and an average particle diameter of 3 μm or less were mixed at atomic ratios of In/(In+Sn+Zn)=0.54, Sn/(In+Sn+Zn)=0.18, and Zn/(In+Sn+Zn)=0.28. The mixture was supplied to a wet-type ball mill and pulverized for 72 hours to obtain a raw material powder.

The resulting fine powder of the raw materials was granulated and the granules were press-molded to obtain a molded article with a diameter of 10 cm and a thickness of 5 mm. The molded article was put into a firing kiln and fired at 1,400° C. under oxygen pressure for 48 hours to obtain a sintered body (target).

(2) Preparation of Transparent Conductive Oxide Film

The sputtering target obtained in (1) above was mounted on a DC magnetron sputtering apparatus to prepare a transparent conductive film on a glass substrate placed on a rotation stage.

The sputtering was carried out under the conditions of a sputtering pressure of $1 \times 10^{-1}$ Pa, an oxygen partial pressure ($O_2/(O_2+Ar)$) of 2%, an ultimate pressure of $5 \times 10^{-4}$ Pa, a substrate temperature of 200° C., electrical power of 120 W, a target-substrate distance of 80 mm, and a film forming time of 15 minutes.

As a result, a transparent conductive glass consisting of a glass substrate and a transparent conductive oxide film with a thickness of 100 nm formed on the glass substrate was obtained. The resulting film was analyzed by the ICP (inductively coupled plasma analysis) method to confirm the atomic ratio of In/(In+Sn+Zn) of 0.60, the atomic ratio of Sn/(In+Sn+Zn) of 0.17, and the atomic ratio of Zn/(In+Sn+Zn) of 0.23. The results show a smaller zinc amount than the amount of zinc in the target. Although the cause is not completely determined, zinc components are assumed to be reversibly sputtered.

(3) Evaluation of Properties of Transparent Conductive Film

To evaluate the electric conductivity of the transparent conductive film on the transparent conductive glass obtained in (2) above, the specific resistance was measured by the four probe method to indicate that the specific resistance was 600 μΩ·cm.

The specific resistance was measured after a heat treatment at 240° C. under atmospheric pressure for one hour to indicate that the specific resistance was 650 μΩ·cm. This shows that there was almost no change (1.1 times the initial value) and the transparent conductive film was stable in the hat treatment under atmospheric pressure. In addition, the specific resistance was measured at 20 points in-plane of the glass substrate to evaluate fluctuation. The difference of the maximum value and the minimum value was about 1.1 times showing that the specific resistance was remarkably uniform throughout the glass substrate.

The transparent conductive film was confirmed to be amorphous by X-ray diffraction analysis.

The measuring conditions of the X-ray-diffraction measurement (XRD) of the target were the same as in Example 1(2)(iv).

To evaluate the smoothness of the film surface, the P-V value (conforming to JIS B0601) was measured to show that the P-V value was 5 nm, indicating good smoothness. To evaluate the transparency of the transparent conductive oxide, transmission of light with a wavelength of 500 nm was measured by a spectrophotometer to confirm that the light transmission was 90%, indicating excellent transparency of the film.

(4) Evaluation of Etching Properties of Transparent Conductive Film

The transparent conductive film on the transparent electric conductive glass obtained in the above (2) was etched with an etching solution containing phosphoric acid (phosphoric acid: 87 wt %, nitric acid: 3 wt %, acetic acid: 10 wt %) at 45° C. and an etching solution containing oxalic acid (oxalic acid: 5 wt %, pure water: 95 wt %) at 35° C. to determine the etching rates.

The etching rate (A) when etched with an etching solution containing phosphoric acid, nitric acid, and acetic acid was 5 nm/min and the etching rate (B) when etched with an etching solution containing oxalic acid was 100 nm/min. The ratio of B/A was 20.

After etching with the etching solution containing oxalic acid, the cross-section was observed with an electron microscope (SEM) and the taper angle was measured to indicate a taper angle of 80°. After over-etching (150%) with the etching solution containing oxalic acid, the cross-section was observed by an electron microscope (SEM) to confirm that almost no etching residue was left.

(5) Evaluation of Adhesiveness of Transparent Conductive Film and Metal

Adhesion to Mo (molybdenum) was evaluated by a scratch test to show that the AE signal standup load was 17 N and the film cracking initiation load was 17 N, confirming excellent adhesion.

The conditions of the scratch test were as follows.
Scratch testing machine: "Micro-Scratch-Tester" manufactured by CSEM
Scratch distance: 20 mm
Scratch load: 0 to 30 N
Load rate: 30 N/min
Scratch rate: 20 mm/min
Diamond stylus form: 0.2 mmR
Detection method: Load cell and AE sensor (6) Preparation and Evaluation of Substrate A 75 nm thick transparent conductive film 12 (FIG. 8(*b*)) was formed, according to the film-forming method (2) above, on a glass substrate 10 using the target of (1) (FIG. 8(*a*)).

Next, an alloy layer 14 was formed on the transparent conductive film 12 using a target of an Ag—Pd—Cu alloy (98.5:0.5:1.0 wt %). The thickness of the alloy layer 14 was 100 nm.

A sensitizer (resist) was applied to the alloy layer 14. A glass board with a mask pattern designed to have a line width of 40 μm and line space of 70 μm was put on the resist. The resist was exposed to light, developed, and post-baked.

Next, the alloy layer 14 was etched with an etching solution containing phosphoric acid (phosphoric acid: 87 wt %, nitric acid: 3 wt %, acetic acid: 10 wt %) to prepare a plurality of lines (line width: 40 μm, line space: 70 μm) of the alloy layer 14 (FIG. 8(*d*)). The resulting blue glass substrate 10 was washed with water and dried.

A sensitizer (resist) was applied to the electrode layer (a line consisting of the transparent conductive film 12 and the alloy layer 14). A glass board with a mask pattern designed to have a line width of 90 μm and line space of 20 μm was put on the resist. The resist was exposed to light, developed, and post-baked. The resist was exposed to light so that the line of the alloy layer 14 meets a part (one side) of the edge of the transparent conductive film 12 (refer to FIG. 8(*e*)).

Next, the transparent conductive film 12 obtained above was etched with a 5 wt % aqueous solution of oxalic acid to prepare a number of lines (line width: 90 μm, line space: 20 μm) of the transparent conductive film 12 (FIG. 8 (*e*)).

The semi-transmissive semi-reflective electrode substrate obtained in this manner attained a low electric resistance. The surface of the substrate was observed with a scanning electron microscope to confirm that there was no roughness on the surface of the transparent conductive film 12. This indicates that the transparent conductive film 12 is rarely etched by an etching solution containing phosphoric acid. In addition, there was almost no change observed on the edge portion of the alloy layer 14 before and after etching with the oxalic acid etching solution.

7) Connection Stability of Tape Carrier Package (TCP

TCP resistance before and after the pressure cooker test (PCT) was compared by TOP connection using an abnormal conductive film (ACF). The initial TCP resistance was 4.7Ω, and the TCP resistance after the PCT test was 4.7Ω, confirming a stable connection.

The TCP resistance is a value of resistance between an arbitrary pair of wires in TOP connection (connection with a metal terminal electrode having a width of $40 \times 10^{-6}$ cm) and is indicated by an average of 50 connected parts with the metal terminal by TCP connection.

Example 11

(1) Production of Sputtering Target

As raw materials for the target, indium oxide, zinc oxide, and tin oxide with a purity of 4N and an average particle diameter of 3 μm or less were mixed at atomic ratios of In/(In+Sn+Zn)=0.44, Sn/(In+Sn+Zn)=0.24, and Zn/(In+Sn+Zn)=0.32. The mixture was supplied to a wet-type ball mill and pulverized for 72 hours to obtain a raw material powder.

The resulting fine powder of the raw materials was granulated, the granules were press-molded to obtain a molded article with a diameter of 10 cm and a thickness of 5 mm. The molded article was put into a firing kiln and fired at 1,400° C. under oxygen pressure for 48 hours to obtain a sintered body (target).

(2) Preparation of Transparent Conductive Oxide Film

The sputtering target obtained in (1) above was mounted on a DC magnetron sputtering apparatus to prepare a transparent conductive film on a glass substrate placed on a rotation stage.

The sputtering was carried out under the conditions of a sputtering pressure of $2 \times 10^{-1}$ Pa, an oxygen partial pressure ($O_2/(O_2+Ar)$) of 2%, an ultimate pressure of $5 \times 10^{-4}$ Pa, a substrate temperature of 200° C., a target-substrate distance of 80 mm, electrical power of 120 W, and a film forming time of 15 minutes.

As a result, a transparent conductive glass consisting of a glass substrate and a transparent conductive oxide with a thickness of 100 nm formed on the glass substrate was obtained. The resulting film was analyzed by the ICP method to confirm the atomic ratio of In/(In+Sn+Zn) of 0.50, the atomic ratio of Sn/(In+Sn+Zn) of 0.23, and the atomic ratio of Zn/(In+Sn+Zn) of 0.27. The results indicate a smaller zinc amount than the amount of zinc in the target. Although the cause is not completely determined, zinc components are assumed to be reversibly sputtered.

(3) Evaluation of Properties of Transparent Conductive Film

The properties were evaluated in the same manner as in Example 10(3). The results are shown in Table 4.

(4) Evaluation of Etching Properties of Transparent Conductive Film

The etching properties were evaluated in the same manner as in Example 10(4). The results are shown in Table 4.

(5) Evaluation of Adhesiveness of Transparent Conductive Film and Metal

The adhesiveness was evaluated in the same manner as in Example 10(5). The results are shown in Table 4.

(6) Preparation and Evaluation of Substrate

The substrate was prepared in the same manner as in Example 10(6).

The resulting semi-transmissive semi-reflective electrode substrate exhibited a low electric resistance. The surface of the substrate was observed with a scanning electron microscope to confirm that there was no roughness on the surface of the transparent conductive film 12. This indicates that the transparent conductive film 12 is rarely etched by an etching solution containing phosphoric acid. In addition, there was almost no change observed on the edge portion of the alloy layer 14 before and after etching with an oxalic acid etching solution.

7) Connection Stability of TCP (Tape Carrier Package)

The connection stability was evaluated in the same manner as in Example 10(7). The results are shown in Table 4.

Example 12

A sputtering target and a transparent conductive film were produced and evaluated in the same manner as in Example 10, except for adjusting the raw material composition to the atomic ratios shown in Table 3. The results are shown in Table 4.

Comparative Examples 11 to 13

Sputtering targets and transparent conductive films were produced and evaluated in the same manner as in Example 10, except for adjusting the raw material compositions to the atomic ratios shown in Table 3. The results are shown in Table 4.

Comparative Examples 14 to 16

Sputtering targets and transparent conductive films were produced and evaluated in the same manner as in Example 11, except for adjusting the raw material compositions to the atomic ratios shown in Table 3. The results are shown in Table 4.

TABLE 3

|  |  | Example | | | Comparative Example | | | | | |
|---|---|---|---|---|---|---|---|---|---|---|
|  |  | 10 | 11 | 12 | 11 | 12 | 13 | 14 | 15 | 16 |
| Atomic ratio | In/(In + Sn + Zn) | 0.54 | 0.44 | 0.61 | 0.60 | 0.58 | 0.50 | 0.50 | 0.48 | 0.40 |
|  | Sn/(In + Sn + Zn) | 0.18 | 0.24 | 0.17 | 0.40 | 0.30 |  | 0.50 | 0.40 |  |
|  | Zn/(In + Sn + Zn) | 0.28 | 0.32 | 0.22 |  | 0.12 | 0.50 |  | 0.12 | 0.60 |

TABLE 4

|  |  |  | Example | | | Comparative Example | | | | | |
|---|---|---|---|---|---|---|---|---|---|---|---|
|  |  |  | 10 | 11 | 12 | 11 | 12 | 13 | 14 | 15 | 16 |
| Atomic ratio |  | In/ (In +Sn +Zn) | 0.60 | 0.50 | 0.68 | 0.60 | 0.60 | 0.57 | 0.50 | 0.50 | 0.50 |
|  |  | Sn/ (In +Sn +Zn) | 0.17 | 0.23 | 0.16 | 0.40 | 0.30 | 0.00 | 0.50 | 0.40 |  |
|  |  | Zn/ (In +Sn +Zn) | 0.23 | 0.27 | 0.16 |  | 0.10 | 0.43 |  | 0.10 | 0.50 |
| Properties of film | Specific resistance | Initial value ($\mu\Omega \cdot$ cm) | 600 | 650 | 450 | 800 | 650 | 800 | 850 | 750 | 850 |
|  |  | After heat test (under atmospheric pressure, 240° C., 1 hour) ($\mu\Omega \cdot$ cm) | 650 | 690 | 480 | 850 | 700 | 1,700 | 900 | 750 | 2,400 |
|  |  | After heat test ÷ initial value (times) | 1.1 | 1.1 | 1.1 | 1.1 | 1.1 | 2.1 | 1.1 | 1.0 | 2.8 |
|  |  | Distribution (in-plane maximum ÷ in-plane minium (times)) | 1.1 | 1.1 | 1.1 | 23 | 6 | 17 | 25 | 8 | 20 |
|  | Crystallinity | X-ray diffraction | Amorphous | Amorphous | Amorphous | Microcrystalline | Amorphous | Amorphous | Microcrystalline | Amorphous | Amorphous |
|  | Smoothness | P-V value (nm) | 5 | 5 | 5 | 10 | 5 | 5 | 10 | 5 | 5 |
|  | Light transmission | (%) | 90 | 90 | 90 | 90 | 87 | 88 | 90 | 86 | 88 |
|  | Etching rate (A) | Etching solution containing phosphoric acid, nitric acid, and acetic acid at 45° C. (nm/min) | 5 | 2 | 3 | <1 | <1 | 2,000 | <1 | <1 | 2,000 |

TABLE 4-continued

| | | Example | | | Comparative Example | | | | | |
|---|---|---|---|---|---|---|---|---|---|---|
| | | 10 | 11 | 12 | 11 | 12 | 13 | 14 | 15 | 16 |
| Etching rate (B) | Etching solution containing oxalic acid at 35° C. (nm/min) | 100 | 60 | 45 | Unable to etch | 20 | 2,000 | Unable to etch | 10 | 2,000 |
| | B /A | 20 | 30 | 15 | | | 1 | | | 1 |
| Taper angle (etching with oxalic acid) | (Degree) | 80 | 80 | 85 | 95 | 95 | 25 | 95 | 95 | 25 |
| Etching residue | Electron microscope | Good | Good | Good | Bad | Bad | Good | Bad | Bad | Good |
| Adhesiveness | AE signal standup load (N) | 17 | 17 | 16 | 13 | 14 | 16 | 12 | 14 | 16 |
| | Film cracking initiation load (N) | 17 | 17 | 16 | 13 | 14 | 16 | 12 | 14 | 16 |
| TCP connection stability | Initial value (T0) (Ω) | 4.7 | 4.8 | 4.2 | 5.0 | 4.8 | 6.5 | 5.1 | 4.9 | 6.7 |
| | After PCT (T1) (Ω) | 4.7 | 4.8 | 4.2 | 5.0 | 4.9 | 90 | 5.1 | 5.1 | 105 |
| | Bate of increase (T1/T0 × 100) (%) | 100 | 100 | 100 | 100 | 102 | 1,385 | 100 | 104 | 1,567 |

The invention claimed is:

1. A transparent conductive film comprising an amorphous oxide of indium (In), zinc (Zn), and tin (Sn), satisfying the following atomic ratio $0.50 < In/(In+Zn+Sn) < 0.75$ $0.11 < Sn/(In+Zn+Sn) < 0.20$ $0.20 < Zn/(In+Zn+Sn) < 0.34$.

2. The transparent conductive film according to claim 1, having a ratio of an etching rate when etched with an etching solution containing oxalic acid to an etching rate when etched with an etching solution containing phosphoric acid of 10 or more.

3. A transparent electrode comprising the transparent conductive film according to claim 1 with a taper angle of 30 to 89°.

4. An electrode substrate comprising the transparent electrode comprising the transparent conductive film according to claim 1 and a layer of a metal or an alloy.

5. The electrode substrate according to claim 4, wherein the metal or alloy comprises an element selected from the group consisting of Al, Ag, Cr, Mo, Ta, and W.

6. The electrode substrate according to claim 4, which is to be used for a semi-transmissive or semi-reflective liquid crystal.

7. The electrode substrate according to claim 4, wherein the layer of the metal or alloy is an auxiliary electrode.

8. A method for producing the electrode substrate according to claim 4 comprising the steps of:
preparing a transparent conductive film;
forming a layer of a metal or an alloy at least on a part of the transparent conductive film;
etching the layer of a metal or alloy with an etching solution containing an oxo acid; and
etching the transparent conductive film with an etching solution containing a carboxylic acid.

9. A transparent electrode comprising the transparent conductive film according to claim 4 with a taper angle of 30 to 89°.

10. A liquid crystal display, containing an electrode substrate according to claim 4.

11. A transparent conductive film according to claim 1, consisting essentially of an amorphous oxide of indium (In), zinc (Zn), and tin (Sn).

12. A transparent conductive film according to claim 1, consisting of an amorphous oxide of indium (In), zinc (Zn), and tin (Sn).

13. A transparent conductive film comprising an amorphous oxide of indium (In), zinc (Zn), and tin (Sn), satisfying the following atomic ratio $0.50 < In/(In+Zn+Sn) < 0.75$ $0.16 < Sn/(In+Zn+Sn) \le 0.19$ $0.20 < Zn/(In+Zn+Sn) < 0.34$.

14. The transparent conductive film according to claim 13, having a ratio of an etching rate when etched with an etching solution containing oxalic acid to an etching rate when etched with an etching solution containing phosphoric acid of 10 or more.

15. A transparent electrode comprising the transparent conductive film according to claim 13 with a taper angle of 30 to 89°.

16. An electrode substrate comprising the transparent electrode comprising the transparent conductive film according to claim 13 and a layer of a metal or an alloy.

17. The electrode substrate according to claim 16, wherein the metal or alloy comprises an element selected from the group consisting of Al, Ag, Cr, Mo, Ta, and W.

18. The electrode substrate according to claim 16, wherein the layer of the metal or alloy is an auxiliary electrode.

19. A transparent conductive film according to claim 13, consisting of an amorphous oxide of indium (In), zinc (Zn), and tin (Sn).

20. A transparent conductive film comprising an amorphous oxide of indium (In), zinc (Zn), and tin (Sn), satisfying the following atomic ratio $0.56 \le In/(In+Zn+Sn) \le 0.65$ $0.16 \le Sn/(In+Zn+Sn) \le 0.19$ $0.20 < Zn/(In+Zn+Sn) \le 0.30$.

* * * * *